United States Patent
Yamazoe et al.

(10) Patent No.: US 7,214,453 B2
(45) Date of Patent: May 8, 2007

(54) MASK AND ITS MANUFACTURING METHOD, EXPOSURE, AND DEVICE FABRICATION METHOD

(75) Inventors: Kenji Yamazoe, Tochigi (JP); Kenji Saitoh, Tochigi (JP); Akiyoshi Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 520 days.

(21) Appl. No.: 10/783,218

(22) Filed: Feb. 20, 2004

(65) Prior Publication Data

US 2004/0166422 A1 Aug. 26, 2004

(30) Foreign Application Priority Data

Feb. 21, 2003 (JP) .............................. 2003-044992

(51) Int. Cl.
*G03F 1/00* (2006.01)
(52) U.S. Cl. ......................................................... 430/5
(58) Field of Classification Search .................... 430/5, 430/30, 394; 716/19–21
See application file for complete search history.

(56) References Cited

U.S. PATENT DOCUMENTS

| 6,048,647 | A | 4/2000 | Miyazaki et al. |
| 6,686,108 | B2 | 2/2004 | Inoue et al. |
| 6,841,801 | B2 | 1/2005 | Kim et al. |
| 2002/0151157 | A1 | 10/2002 | Kim et al. |
| 2002/0177048 | A1 | 11/2002 | Saitoh et al. |
| 2003/0198872 | A1* | 10/2003 | Yamazoe et al. ............... 430/5 |
| 2004/0161678 | A1* | 8/2004 | Misaka .......................... 430/5 |
| 2005/0064304 | A1 | 3/2005 | Kim et al. |

FOREIGN PATENT DOCUMENTS

| DE | 19510564 A | 10/1995 |
| JP | 6-289591 A | 10/1994 |
| JP | 07-281413 | 10/1995 |
| JP | 2002-351052 | 12/2002 |
| JP | 2003-234285 | 8/2003 |
| JP | 2005-142599 | 6/2005 |
| KR | 2002080745 | 10/2002 |
| WO | 02/088843 | 7/2002 |

OTHER PUBLICATIONS

Korean Office Action with English translation, Nov. 24, 2005.
Hur et al., "Effect of pattern density for contact windows in an attenuated phase shift mask", Proc. SPIE vol. 2440, 1995, pp. 278-289.
Singapore Patent Office Letter dated Feb. 1, 2006 forwarding Australian Patent Office Search Report and Written Opinion dated Dec. 21, 2005.

* cited by examiner

*Primary Examiner*—S. Rosasco
(74) *Attorney, Agent, or Firm*—Morgan & Finnegan, LLP

(57) ABSTRACT

A mask arranges a predetermined pattern and an auxiliary pattern smaller than the predetermined pattern so that where a virtual lattice is assumed which has a lattice point located at a center of the predetermined pattern, a center of the auxiliary pattern is offset from the lattice point of the virtual lattice.

10 Claims, 38 Drawing Sheets

MASK AND ITS MANUFACTURING METHOD, EXPOSURE, AND DEVICE FABRICATION METHOD

This application claims a benefit of priority based on Japanese Patent Application No. 2003-044992, filed on Feb. 21, 2003, which is hereby incorporated by reference herein in its entirety as if fully set forth herein.

BACKGROUND OF THE INVENTION

The present invention relates generally to exposure, and more particularly to a mask used to fabricate various devices including semiconductor chips such as ICs and LSIs, display devices such as liquid crystal panels, sensing devices such as magnetic heads, and image pick-up devices such as CCDs, and micromechanics, and a mask manufacturing method, and an exposure method, a device fabricating method. The exposure apparatus and method are. The micromechanics, as used herein, is technology for applying the semiconductor IC fabricating technique for fabrications of fine structures, thereby creating an enhanced mechanical system that may operate at a level of micron.

The fabrication of a device using the lithography technique has employed a projection exposure apparatus that uses a projection optical system to project a pattern drawn on a mask or reticle onto a wafer, thereby transferring the pattern. The projection optical system enables diffracted beams from the pattern to interfere on a wafer and forms an image. The normal exposure enables 0-th order and ±1st order diffracted beams (namely, three beams) to interfere with each other.

Mask patterns include an adjacent and periodic line and space (L & S) pattern, a line of contact holes that are adjacent and periodic (i.e., arranged at the same interval as the hole diameter), isolated contact holes that are non-adjacent and isolated, other isolated patterns, etc., and a transfer of a pattern with high resolution requires a selection of optimal exposure conditions (such as illumination conditions, exposure light amount, etc.) in accordance with kinds of patterns.

The resolution R of a projection exposure apparatus is given in the following Rayleigh equation:

$$R = k_1(\lambda/NA) \quad (1)$$

where $\lambda$ is a wavelength of a light source, NA is a numerical aperture of the projection optical system, $k_1$ is a constant determined by a development process and others. In a normal exposure case, $k_1$ is approximately 0.5–0.7.

The recent demand for highly integrated devices have increasingly required more fine patterns to be transferred or higher resolution. Although the above equation reveals that the higher numerical aperture NA and reduced wavelength $\lambda$ would effectively achieve the higher resolution, improvements of these factors have already reached the limit at the current stage. Thus, it is difficult for the normal exposure to form a pattern of 0.15 μm or less onto a wafer. Accordingly, it has been suggested to employ the phase shift mask technology that enables two beams out of those diffracted beams, which have passed through a pattern, to interfere with each other, thus forming an image. See, for example, U.S. patent application Publication No. 2002/177048. The phase shift mask reverses, by 180°, phases of adjacent light-transmitting portions on it, and cancels out the 0-th order diffracted beam, thus enabling two ±1st order diffracted beams to interfere with each other and forming an image. Use of this technique would reduce $k_1$ in the above equation down to substantially 0.25, thus improving the resolution R and forming a pattern of 0.15 μm or less onto a wafer.

However, when adjacent phases are altered by 180° for fine contact holes near the resolution limit, light is diffracted at a wide angle from the optical axis, i.e., in a direction of 45° on the pupil plane and, and deviates from the pupil in the projection system. As a result, the diffracted light can neither pass the pupil in the projection lens nor resolve. What can resolve is, at best, a fine pattern down to square root 2 times a marginal critical dimension in the L & S.

Moreover, the recent semiconductor industry has been shifting its production to system chips that include highly value-added and various types of patterns, and thus it has become necessary to form more than one kind of contact hole pattern on a mask. Therefore, a contact line of holes (or contact holes array) has been demanded to have resolution equivalent to that of the L & S pattern. However, a prior art phase shift mask has not yet sufficiently exposed, at one time with high resolution, a contact hole pattern blended with a contact hole line and an isolated contact hole. It is, on the other hand, conceivable to use the double exposure (or multiple exposure) with two or more masks to expose different kinds of patterns separately, but the conventional double exposure requires two masks and incurs many practical disadvantages: That is, this approach results in an increased cost and lowered throughput because of two exposure steps, as well as requiring high overlay accuracy for two mask exchanges.

BRIEF SUMMARY OF THE INVENTION

Accordingly, it is an exemplary object of the present invention to provide a mask and its manufacturing method, an exposure method that can expose, without exchanging a mask, a pattern that has one or more holes with a fine hole diameter (e.g., of 0.15 μm or less), with high resolution.

A mask of one aspect according to the present invention includes a predetermined pattern and an auxiliary pattern smaller than the predetermined pattern which are arranged so that where a virtual lattice is assumed which has a lattice point located at a center of the predetermined pattern, a center of the auxiliary pattern is offset from the lattice point of the virtual lattice.

The auxiliary pattern may be approximately located on the virtual lattice. An offset between a center of the auxiliary pattern and a corresponding lattice point may be ⅙ to ⅚ or ⅓ to ⅔ as long as a period of the virtual lattice. The auxiliary pattern may have an opening, and a center of two lattice points in the virtual lattice may be located at the opening of the auxiliary pattern. The predetermined pattern may include plural differently sized patterns which intend to form the same size of patterns on an object to be exposed. The auxiliary pattern may include first and second auxiliary patterns having different areas from each other.

A mask of another aspect according to the present invention includes a predetermined pattern and an auxiliary pattern smaller than the predetermined pattern which are arranged so that where a virtual lattice is assumed which has an origin approximately located at a center of the predetermined pattern, the closest auxiliary pattern to the predetermined pattern on the virtual lattice among auxiliary patterns oblique to the predetermined pattern is within a range between 0° and 45°. The closest auxiliary pattern to the predetermined pattern on the virtual lattice among auxiliary patterns oblique to the predetermined pattern may be within a range between 9° and 40°.

A mask of another aspect according to the present invention includes a predetermined contact hole pattern and an auxiliary pattern that includes a contact hole smaller than the predetermined pattern which are arranged so that where a virtual lattice is assumed which has a lattice point on the predetermined contact hole pattern, the auxiliary pattern is offset from the lattice point of the virtual lattice. An offset may be ⅙ to ⅚ as long as a period of the virtual lattice.

A mask of still another aspect according to the present invention includes plural predetermined patterns, and an auxiliary pattern smaller than the predetermined pattern, wherein a virtual lattice formed by the plural predetermined patterns defines at least one virtual rectangle, and the auxiliary pattern is arranged at or near a node between diagonal lines. The plural predetermined patterns and the auxiliary pattern may be arranged so that the plural predetermined patterns and the auxiliary pattern have a period in a direction of the diagonal line.

An exposure method of another aspect according to the present invention includes the step of illuminating the above mask by using light that enables the predetermined pattern to resolve and prevents the auxiliary pattern from resolving, and exposing an object using the light from the mask. The illuminating step may illuminate the mask under an illumination condition that provides bright positions apart from an optical axis by about $r/(4·\alpha)$ on a coordinate system around the optical axis on a pupil surface in the projection optical system, where r is a radius of a pupil in the projection optical system, and $\alpha$ is a value of a half cycle of the virtual lattice times a numerical aperture of the projection optical system divided by a wavelength of the light.

An exposure method of another aspect according to the present invention includes the step of illuminating the above mask by using light that enables the predetermined pattern to resolve and prevents the auxiliary pattern from resolving, and exposing an object using the light from the mask via a projection optical system, wherein the illuminating step illuminates the mask under an illumination condition that provides bright positions apart from an optical axis by about $1/(4·\alpha)$ on a coordinate system around the optical axis on an effective light source, where $\alpha$ is a value of a half cycle of the virtual lattice times a numerical aperture of the projection optical system divided by a wavelength of the light. The effective light source may have a dark center portion.

A mask designing method of another aspect according to the present invention suitable for an exposure method for illuminating a mask by using light that enables the predetermined pattern to resolve and prevents the auxiliary pattern from resolving, and for exposing an object using the light from the mask via a projection optical system includes the step of arranging the auxiliary pattern such that three beams that are not aligned with a straight line enter a pupil surface in the projection optical system. The three beams may be least one of (−1, ½) diffracted light, (−1, −½) diffracted light, (1, ½) diffracted light, (1, −½) diffracted light, (½, 1) diffracted light, (½, −1) diffracted light, (−½, 1) diffracted light and (−½, −1) diffracted light.

A mask designing method of still another aspect according to the present invention suitable for an exposure method for illuminating a mask by using light that enables the predetermined pattern to resolve and prevents the auxiliary pattern from resolving, and for exposing an object using the light from the mask via a projection optical system includes the step of arranging plural auxiliary patterns in a direction other than a periodic direction of the predetermined pattern and other than a direction orthogonal to the periodic direction.

A program that enables a computer to execute the above mask designing method also constitutes one aspect according to the present invention. A device fabricating method of another aspect of the present invention includes the steps of exposing an object using the above mask, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

A description will now be given of embodiments of the present invention with reference to the accompanying drawings. Unless otherwise specified, the following description assumes that an exposure apparatus is a reduction projection exposure apparatus having a reduction ratio of 4:1, a light source of KrF excimer laser (with an exposure wavelength $\lambda$=248 nm) and a projection optical system with NA of 0.73. The projection exposure apparatus generally provides reduction projection exposures. In case of reduction projection exposure, a pattern size to be produced differs from a mask pattern by a magnification in the exposure apparatus. The magnification of the exposure apparatus depends upon its machine type, and this following description converts a pattern size on the mask into a size on the wafer. For example, when a projection exposure apparatus with a magnification of 0.25 forms a pattern of 120 nm on a wafer, a mask should actually form a pattern of 480 nm. When a projection exposure apparatus with a magnification of 0.20 forms a pattern of 120 nm on a wafer, a mask needs to form a pattern of 600 nm. For simplicity purposes, the following description converts the mask pattern's size into the wafer's size, and calls the pattern of 120 nm. Although each pattern includes one or more contact holes, the term "pattern" sometimes means part of the pattern or one contact hole.

The instant inventors have already succeeded in exposing a fine contact hole pattern onto an object, such as a wafer, by arranging an auxiliary pattern around a desired pattern on a binary mask, and by providing a special oblique incidence illumination. The auxiliary pattern is smaller than the desired pattern, and has such a size that the auxiliary pattern does not resolve. For example, a desired pattern shown in FIG. 3C has a hole diameter 100 nm, and a minimum hole interval of 100 nm.

Figure 3A:
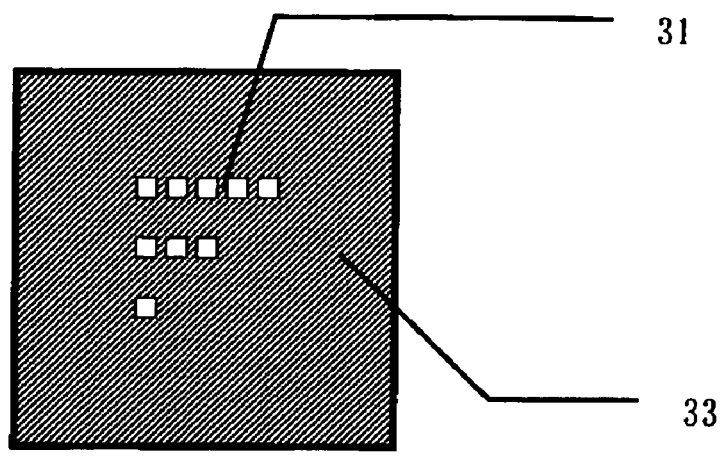
FIG. 3A is a plan view showing a conventional mask.
Figure 8:
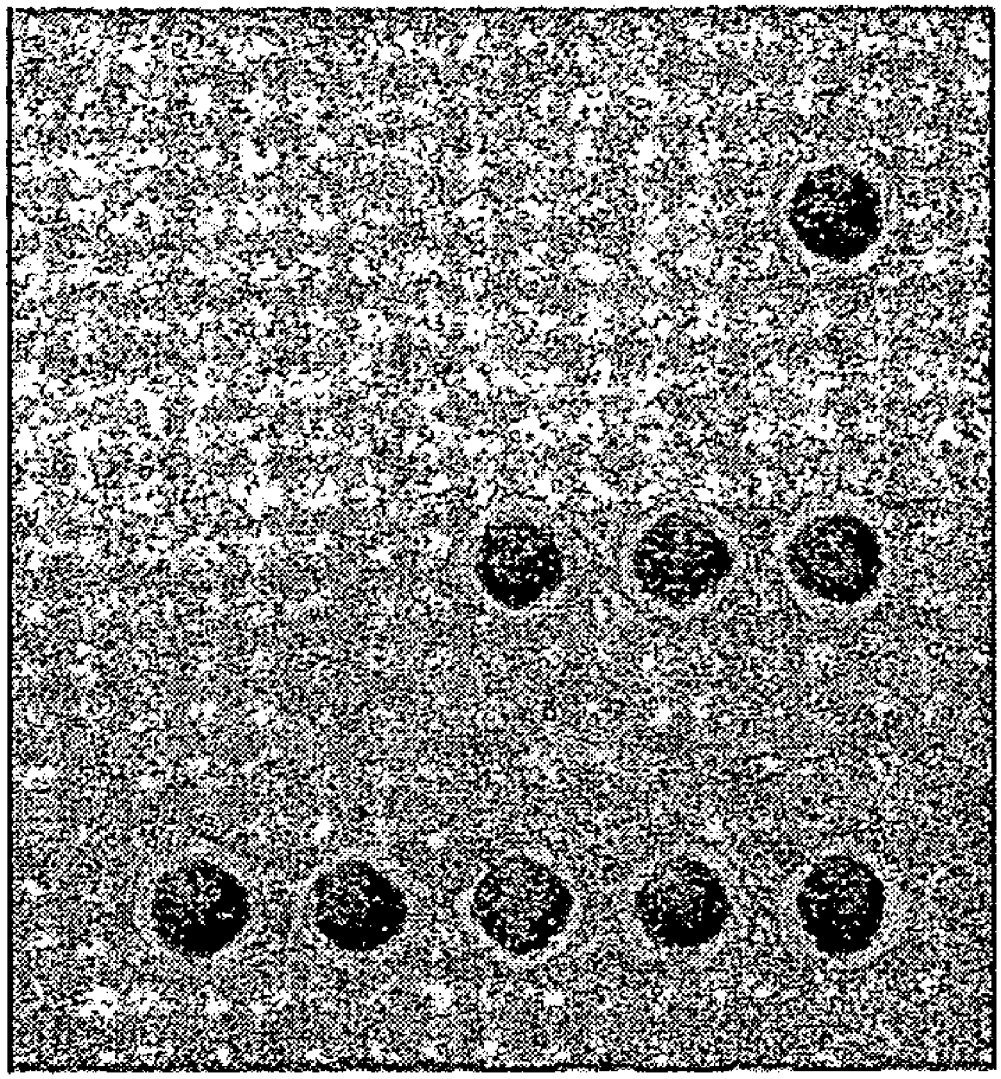
FIG. 8 is a diagram showing an exposure result according to the inventive exposure method.

The above projection exposure apparatus usually uses a mask that arranges light-transmitting portions 31 and light-shielding portion 33 in accordance with the desired pattern as schematically shown in FIG. 3A, and illuminates the mask with an effective light source having circular intensity distribution, when exposing a wafer. However, this method cannot resolve the pattern. On the other hand, when the exposure to the wafer uses a mask that arranges fine light-transmitting portions 32 around light-transmitting portions 31 in the light-shielding portion 33 as schematically shown in FIG. 3B, as well as an illumination optical system that has an effective light intensity distribution with a cross-shaped light-shielding portion 42A shown in FIG. 4A, a pattern resolves on the wafer as shown in FIG. 8.

Figure 3B:
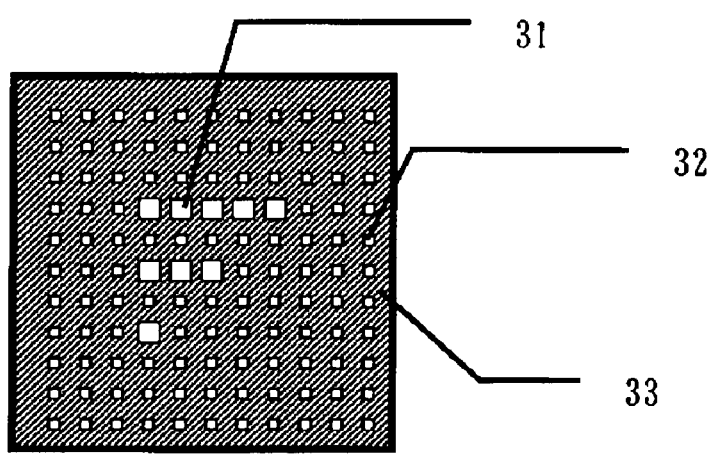
FIG. 3B is a plan view showing a mask used in an exposure method of one embodiment according to the present invention.
Figure 3C:
FIG. 3C is a diagram showing a predetermined contact hole pattern.
Figure 4A:
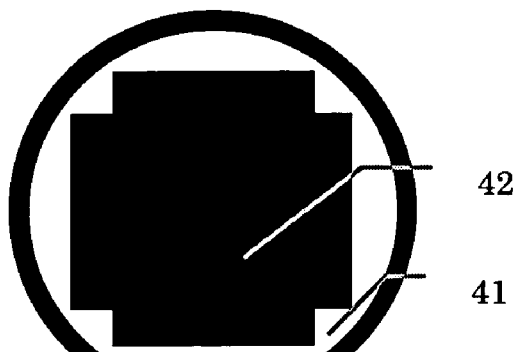
FIGS. 4A to 4F are diagrams of effective light sources shapes in an illumination optical system applicable to the inventive exposure method.

The mask shown in FIG. 3B is a binary mask that has a desired pattern 31, and an auxiliary pattern 32 arranged periodically around the desired pattern 31 in longitudinal and lateral directions. The auxiliary pattern 32 is smaller than the desired pattern 31, and has such a size that the auxiliary pattern 32 does not resolve. In FIG. 4A, a white area 41 denotes a light emitting area, and a black area 42 is a light blocking area. A wafer used a silicon substrate, and TOK-DP746HC as resist with a thickness of 350 nm.

This exposure method forms a mask that includes a desired contact hole pattern, a dummy contact hole having a hole diameter smaller than that of the desired contact hole pattern, and resolves only the desired contact hole pattern (while this exposure method is sometimes referred to as an "exposure method I" in the instant application). The instant inventors have confirmed that similar results can be obtained when the exposure method I uses effective light source shapes shown in FIGS. 4B, 4C and 4D.

Figure 5A:
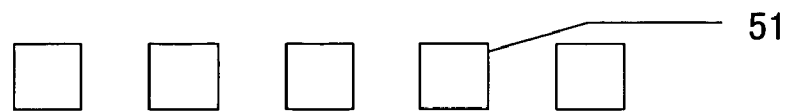
FIG. 5A is a diagram showing a predetermined contact hole pattern.
Figure 5B:
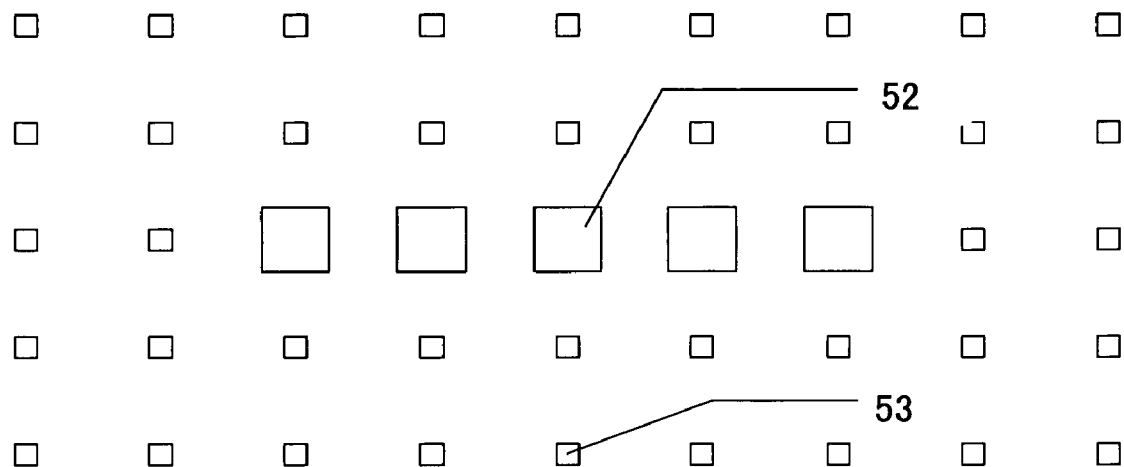
FIGS. 5B and 5C are schematic diagrams of mask patterns applicable to the inventive exposure method.

A basic concept of the exposure method I is to periodically dispose an auxiliary pattern. For example, in exposing a contact hole pattern shown in FIG. 5A, it is conceivable to insert an auxiliary pattern in the longitudinal and lateral directions around the desired contact hole pattern, as shown in FIG. 5B. This exposure method makes a depth of focus longer than that in a usual exposure method, and reduces exposure dose necessary to form a pattern, thus increasing so-called throughput.

Figure 5C:
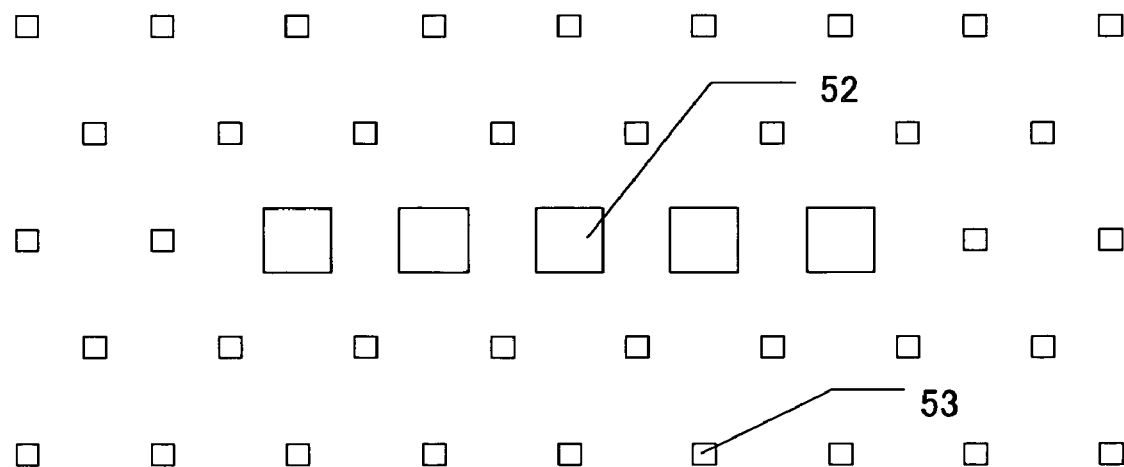

As a result of further studies of the above exposure method for further improved resolution and throughput and larger depth of focus, the instant inventors have discovered that use of such a mask is preferable as includes an auxiliary pattern as shown in FIG. 5C. The mask shown in FIG. 5C has the following features: First, where a virtual orthogonal lattice is assumed which arranges its lattice points at centers of a desired contact hole pattern, a center of an auxiliary pattern is located at a position offset from a lattice point of the virtual orthogonal lattice. Next, a contact hole in the auxiliary pattern located oblique to and closest to a desired contact hole on the virtual orthogonal lattice is located between 0° and 45° (greater than 0° and smaller than 45°), as described later. An auxiliary pattern smaller in size than a desired contact hole pattern is arranged while offset from lattice points every other column or row on a virtual lattice arranged according to a period of the desired contact hole pattern.

An auxiliary pattern is usually disposed above, under, on the right and left of a desired pattern. The auxiliary pattern itself does not resolve, but influences and improves the resolution of the desired pattern. Thus, it is natural to dispose an auxiliary pattern adjacent to a desired pattern in longitudinal and lateral directions. However, the instant inventors have discovered that an alternate arrangement of the auxiliary pattern extends a depth of focus rather than the longitudinal/lateral arrangement. For example, the instant inventors have discovered that an insertion of an auxiliary pattern shown in FIG. 5C instead of an auxiliary pattern shown in FIG. 5B into a pattern shown in FIG. 5A would extend a depth of focus.

Figure 6A:
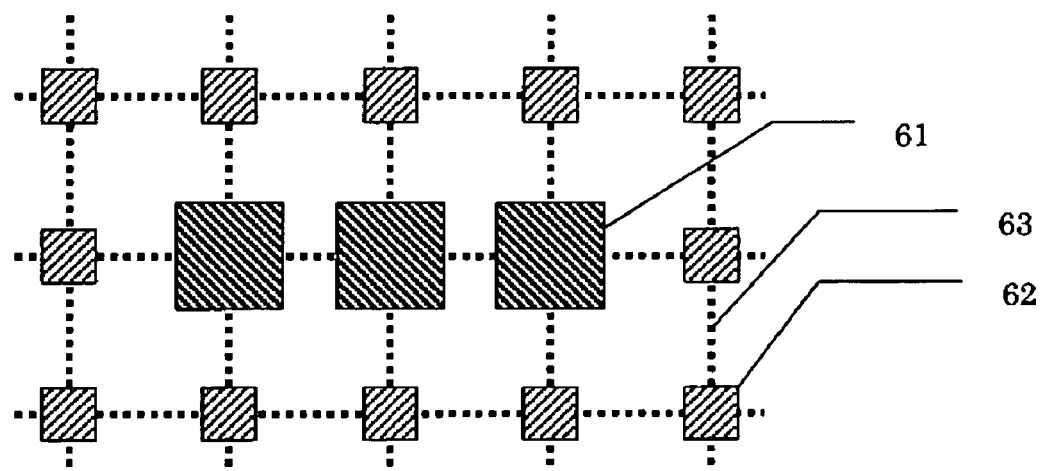
FIGS. 6A to 6C are schematic diagrams showing mask patterns applicable to the inventive exposure method.
Figure 6B:
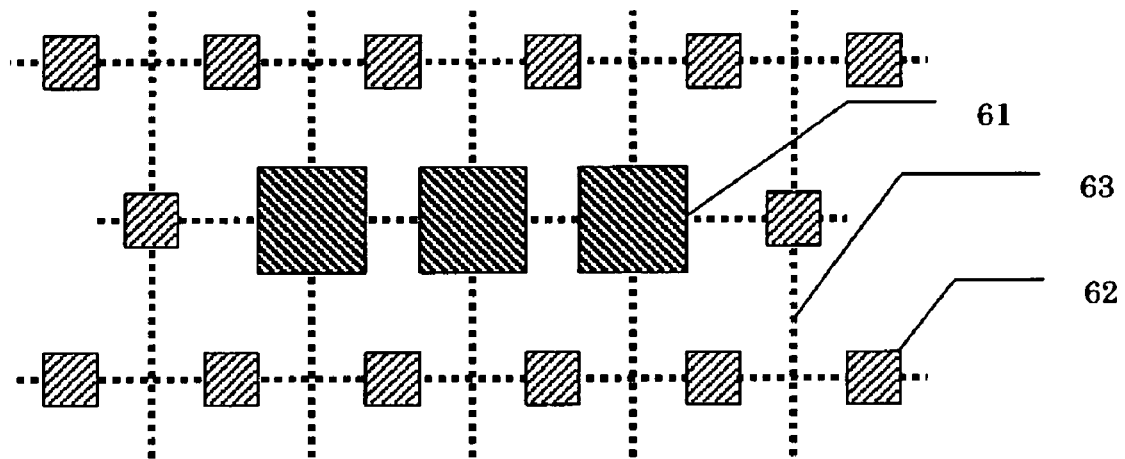
Figure 6C:
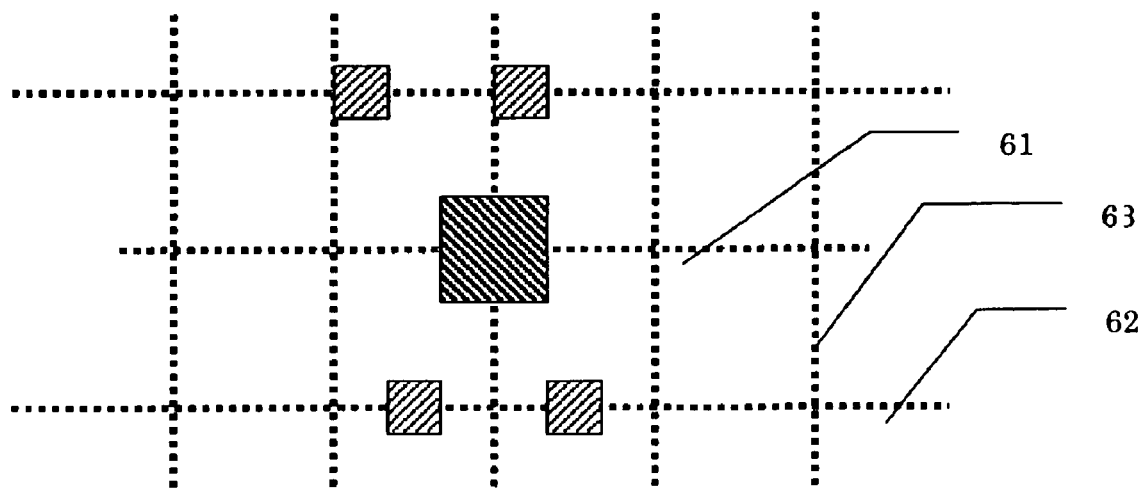

A description will be given of the principle. First, terms "normal arrangement" and "alternate arrangement" will be defined: The "normal arrangement", as schematically shown in FIG. 6A, is to arrange an auxiliary pattern 62 on lattice points in a virtual lattice 63 that accords with a period of a desired pattern 61. On the other hand, the "alternate arrangement", as schematically shown in FIG. 6B, is to arrange an auxiliary pattern at positions laterally offset from the lattice points every other row in the virtual lattice 63 that accords with a period of a desired pattern 61, or to arrange an auxiliary pattern at positions longitudinally offset from the lattice points every other column in the virtual lattice that accords with a period of a desired pattern.

Figure 9A:
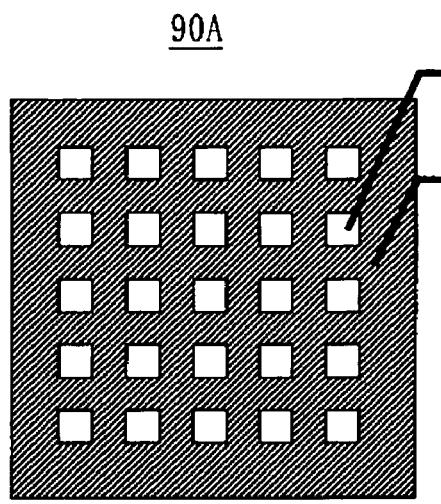
FIGS. 9A and 9B are schematic plan views of masks applicable to the inventive exposure method.
Figure 9B:
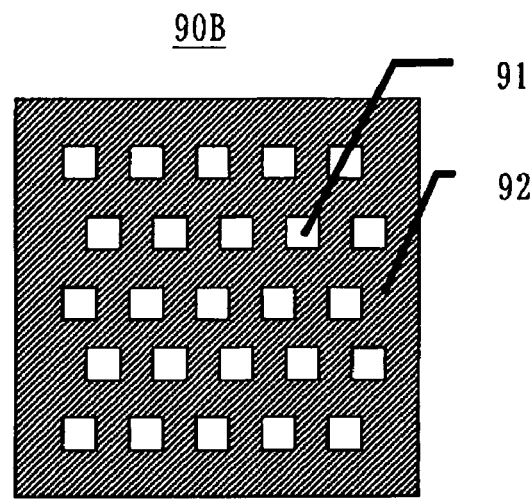

Suppose that a projection optical system exposure patterns on a mask 90A shown in FIG. 9A and a mask 90B shown in FIG. 9B onto a wafer. The mask 90A arranges 120 nm holes and 120 nm spaces in a 5×5 matrix, whereas the mask 90B offsets second and fourth rows laterally by 120 nm in the mask 90A.

Figure 10A:
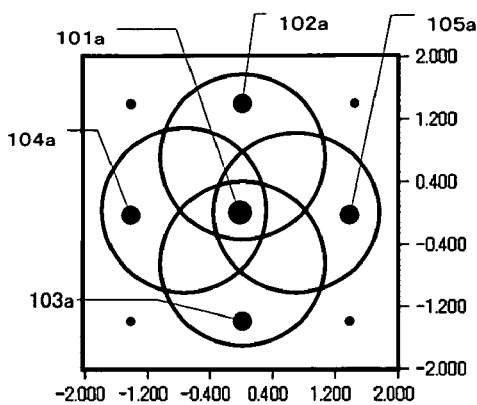
FIGS. 10A to 10H are diagrams of distributions and imaging of diffracted light on a pupil plane, generated from the masks shown in FIGS. 9A and 9B.
Figure 10B:
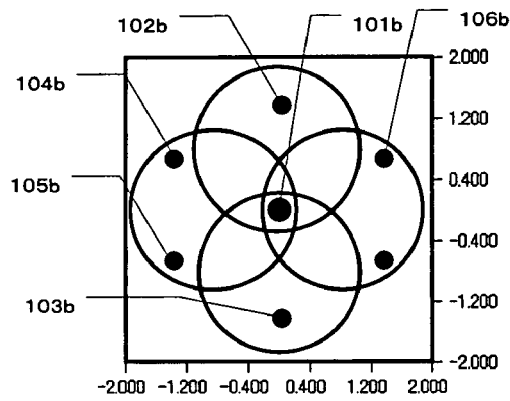

FIGS. 10A and 10B show light intensity distributions on pupil surfaces in a projection optical system when the mask 90A and the mask 90B are illuminated with coherent light, respectively, wherein the coordinate values are normalized to NA/λ or converted into $k_1$ in FIGS. 10A and 10B. FIGS. 10A and 10B show circles with a radius of 1 as a pupil, and suitable oblique incident illumination that offsets longitudinal and lateral diffracted light and takes them in the pupil.

Figure 10C:
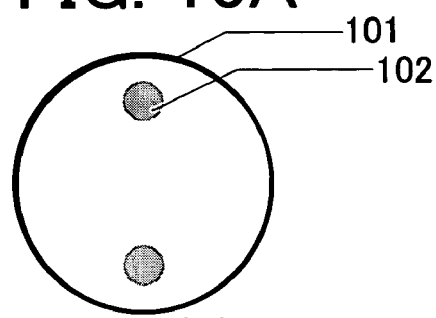
Figure 10D:
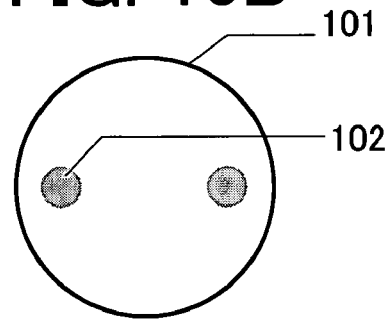
Figure 10E:
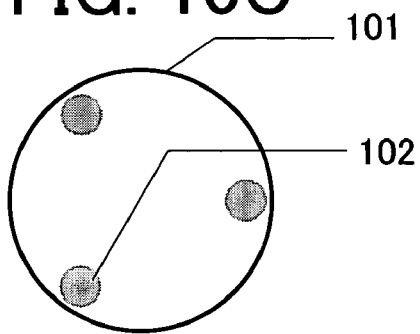
Figure 10F:
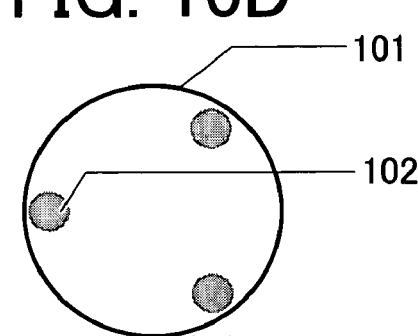

According to mask patterns, appearances of diffracted light, and thus incidences of the diffracted light upon the pupil vary. The mask 90A with oblique incident illumination enables only diffracted light 102 to enter the pupil 101 as shown in FIG. 10C or 10D. On the other hand, it is understood that the mask 90A with oblique incident illumination enables three diffracted beams 102 to enter the pupil 101 as shown in FIG. 10E or 10F without aligning with a straight line. A difference in diffracted light distribution in the pupil results in a decisive difference in imaging performance.

A description will now be given of a difference in resolution in a longitudinal direction. Two types of interference determine the resolution in the longitudinal direction in the mask 90A, i.e., interference between diffracted light 101a with an intensity of 1.00 and diffracted light 102a with an intensity of 0.41, and interference between the diffracted light 101a with the intensity of 1.00 and diffracted light 103a with an intensity of 0.41. On the other hand, four types of interference determine the resolution in the longitudinal direction in the mask 90B, i.e., interference between diffracted light 101b with an intensity of 1.00 and diffracted light 102b with an intensity of 0.41, interference between diffracted light 101b with the intensity of 1.00 and diffracted light 103b with the intensity of 0.41, interference between diffracted light 104b with the intensity of 0.33 and diffracted light 105b with the intensity of 0.33, and interference between diffracted light 106b with the intensity of 0.33 and diffracted light 107b with the intensity of 0.33. Understandably, the mask 90B provides a larger light intensity that contributes to the resolution in the longitudinal direction than the mask 90A.

A description will now be given of a difference in resolution in a lateral direction. Two types of interference determine the resolution in the lateral direction in the mask 90A, i.e., interference between the diffracted light 101a with the intensity of 1.00 and diffracted light 104a with the intensity of 0.41, and interference between the diffracted light 101a with the intensity of 1.00 and diffracted light 105a with the intensity of 0.41. On the other hand, four types of interference determine the resolution in the lateral direction in the mask 90B, i.e., interference between the diffracted light 101b with the intensity of 1.00 and diffracted light 104b with the intensity of 0.33, interference between the diffracted light 101b with the intensity of 1.00 and diffracted light 105b with the intensity of 0.33, interference between the diffracted light 101b with the intensity of 1.00 and diffracted light 106b with the intensity of 0.33, and interference between diffracted light 101b with the intensity of 1.00 and diffracted light 107b with the intensity of 0.33. Also in the resolution in the lateral direction, the mask 90B provides a larger light intensity that contributes to the resolution than the mask 90A.

Figure 10G:
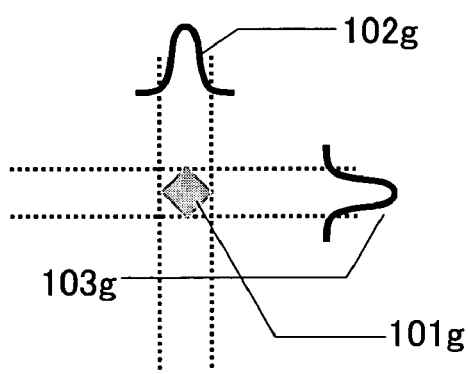

A description will now be given of patterning depending upon a type of mask. FIG. 10G shows patterning with the mask 90A. Interference between the diffracted light 101a and the diffracted light 102a or interface between the diffracted light 101a and the diffracted light 103a forms a light intensity distribution 103g that contributes to patterning in the longitudinal direction. Interference between the diffracted light 101a and the diffracted light 104a or interface between the diffracted light 101a and the diffracted light 105a forms a light intensity distribution 102g that contributes to patterning in the lateral direction. The light intensity distributions 102g and 103g are sinusoidal intensity distributions, and it is understood that when they superimpose onto each other, the resultant light intensity distribution 101g has a generally rhombic form.

Figure 10H:
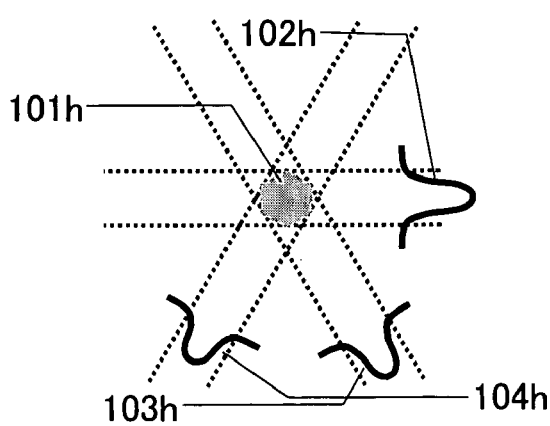

FIG. 10H shows patterning with the mask 90B. Interference between the diffracted light 101b and the diffracted light 102b, interference between the diffracted light 101b and the diffracted light 103b, interference between the diffracted light 104b and the diffracted light 105b, or interference between the diffracted light 106b and the diffracted light 107b forms a light intensity distribution 102h that contributes to patterning in the longitudinal direction. On the other hand, interference between the diffracted light 101b and the diffracted light 105b, or interference between the diffracted light 101b and the diffracted light 106b forms a light intensity distribution 103h. Interference between the diffracted light 101b and the diffracted light 104b, or interference between the diffracted light 101b and the diffracted light 107b forms a light intensity distribution 104h. Those two light intensity distributions contribute to resolution in oblique directions. The light intensity distributions 102h, 103h and 104h are sinusoidal intensity distributions, and when they superimpose onto each other, the resultant light intensity distribution 101h has a generally hexagonally form.

Although a contact hole ideally is a rectangle to exactly reflect a mask pattern, the nature of exposure rounds corners of contact holes and form circular contact holes. An actual hole's deformation from a rectangle is inevitable to some extent. However, a rhombic contact hole that is formed as shown in FIG. 10C significantly reduces a hole area compared with the expected rectangle or circle. On the other hand, it is understood that a hexagonal hole shown in FIG. 10D has a hole area preferably greater than that of the rhomb and closer to the expected hole area.

From the above result, it is understood that an alternately inserted auxiliary pattern provides a better result than a longitudinally and laterally inserted auxiliary pattern around a desired pattern.

An illumination with a dark center portion is suitable for a binary or halftone mask that arranges an auxiliary pattern in the above manner. The illumination with a dark center portion exemplarily includes an annular illumination shown in FIG. 4E, a quadrupole illumination shown in FIG. 4F, and those which form an effective light source having a light intensity shown in FIGS. 4A to 4D. In particular, the illuminations shown in FIGS. 4A to 4D have bright portions in directions of 0° and 90°. In other words, a σ-converted shape of the effective light source distribution has bright portions at about $1/(4·\alpha)$ with respect to the directions of 0° and 90°, where $\alpha$ is a half cycle of the virtual lattice which has been converted into $k_1$, i.e., (half cycle)·NA/λ, and "about" means a range of ±0.05 after a conversion. So-called small σ illumination is suitable for a phase shift mask that forms a phase difference of 180° between adjacent holes.

Figure 23:
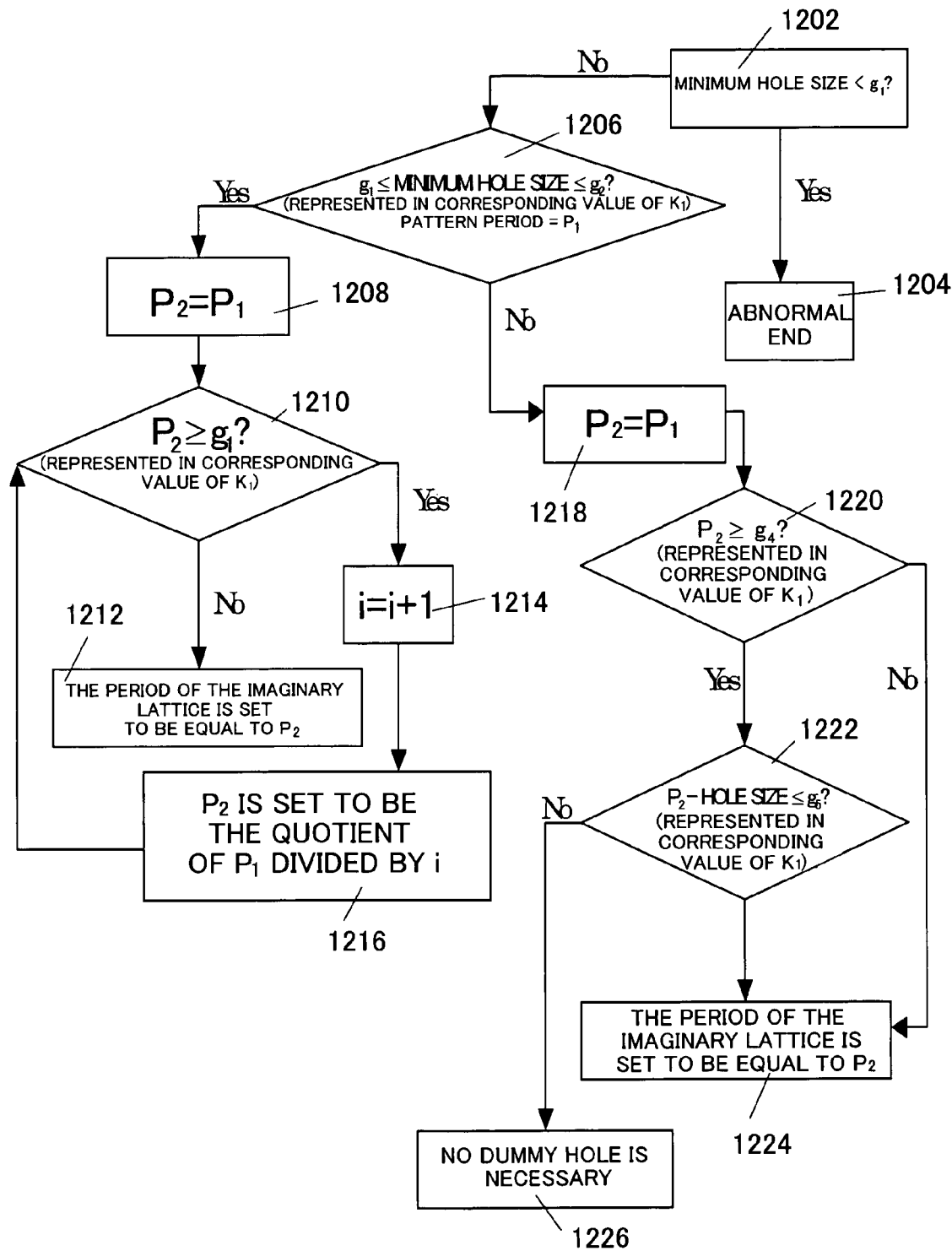
FIG. 23 is a flowchart for explaining a method of determining a virtual lattice according to the present invention.

According to the instant embodiment, once a virtual lattice is determined, an auxiliary pattern can be inserted in an alternate fashion. A description will now be given of a method of determining a virtual lattice with reference to FIG. 23. Here, FIG. 23 is a flowchart for explaining the method for determining the virtual lattice.

The resolving power of the projection exposure apparatus often varies before and after values of 0.25 and $\sqrt{2}$. Thus, FIG. 23 sets $g_1$ to a value between 0.25 and $0.25 \times \sqrt{2}$, $g_2$ to a value between $0.25 \times \sqrt{2}$ and 0.5, $g_3$ to a value between 1.0 and $\sqrt{2}$, $g_4$ to a value between $0.5 \times \sqrt{2}$ and 1.0, and $g_5$ to a value between 0.25 and $0.25 \times \sqrt{2}$. An experimental result shown in FIG. 8 was obtained when values of g1, g2, g3, g4 and g5 were set to 0.29, 0.40, 1.20, 0.80 and 0.25, respectively. In setting a virtual lattice for an isolated pattern, the isolated pattern is placed on a proper virtual lattice, followed by an alternate arrangement. A half cycle of a virtual lattice can be basically the same as an interval of the isolated pattern, but may be the same as a period of any slightly distant periodic pattern.

First, it is determined whether a $k_1$-converted hole diameter D of a desired pattern, i.e., D×NA/λ is smaller than a first threshold value g, (step 1202). If the step 1202 determines so, the process ends with abnormal operation (step 1204). On the other hand, if the step 1202 determines not so, it is further determined whether the hole diameter of the desired pattern is between the first threshold value $g_1$ and the second threshold value g2 (step 1206), where $P_1$ is a period of a periodic pattern.

If the step 1206 determines that the hole diameter of the desired pattern is between the first and second threshold values $g_1$ and $g_2$, then $P_2$ is set to $P_2=P_1$, the procedure moves to "Part I", and it is determined whether the $k_1$-converted $P_2$ is equal to or greater than a third threshold value $g_3$ (step 1210).

If the step 1210 determines that it is smaller than the third threshold value $g_3$, then a period of a virtual lattice is set to $P_2$ (step 1212). If the step 1210 determines that it is equal to or greater than the third threshold value $g_3$, then i is incremented by 1 (step 1214) and the quotient of $P_1$ divided by i is substituted into $P_2$ (step 1216). Thereafter, the period of the virtual lattice is set to $P_2$.

If the step 1206 determines that it is not between the first and second threshold values $g_1$ and $g_2$, then $P_2$ is set to $P_1$ (step 1218), the procedure moves to "Part II", and it is determined whether $k_1$-converted P2 is equal to or greater than a fourth threshold value $g_4$ (step 1220). If the step 1220 determines that it is equal to or greater than the fourth threshold value $g_4$, then it is determined whether a $k_1$-converted difference between $P_2$ and the hole diameter D is equal to smaller than a fifth threshold value $g_5$ (step 1222). If not so, it is regarded as an isolated pattern or the procedure moves to "Part I" (step 1226). On the other hand, if the step 1120 determines that it is smaller than the fourth threshold value $g_4$ or if the step 1222 determines that it is smaller than the fifth threshold value $g_5$, then a period of the virtual lattice is set to $P_2$ (step 1224).

An alternate arrangement is formed by inserting an auxiliary pattern into the virtual lattice thus obtained, and by laterally offsetting the auxiliary pattern every other row or longitudinally offsetting the auxiliary pattern every other column. The offset amount may be between ⅙ and ½ as long as a period of the virtual lattice, as will be described later with reference to specific examples. It is confirmed that a size of the auxiliary pattern may be between 50% and 90%, usually about 75%, of a size of a desired pattern.

A very effective method of inserting an auxiliary pattern has been thus articulated. A description will now be given of a method of inserting an auxiliary pattern and a method of determining an illumination condition. Here, FIG. 24 is a flowchart for explaining a method of determining a mask pattern and an illumination condition.

Figure 24:
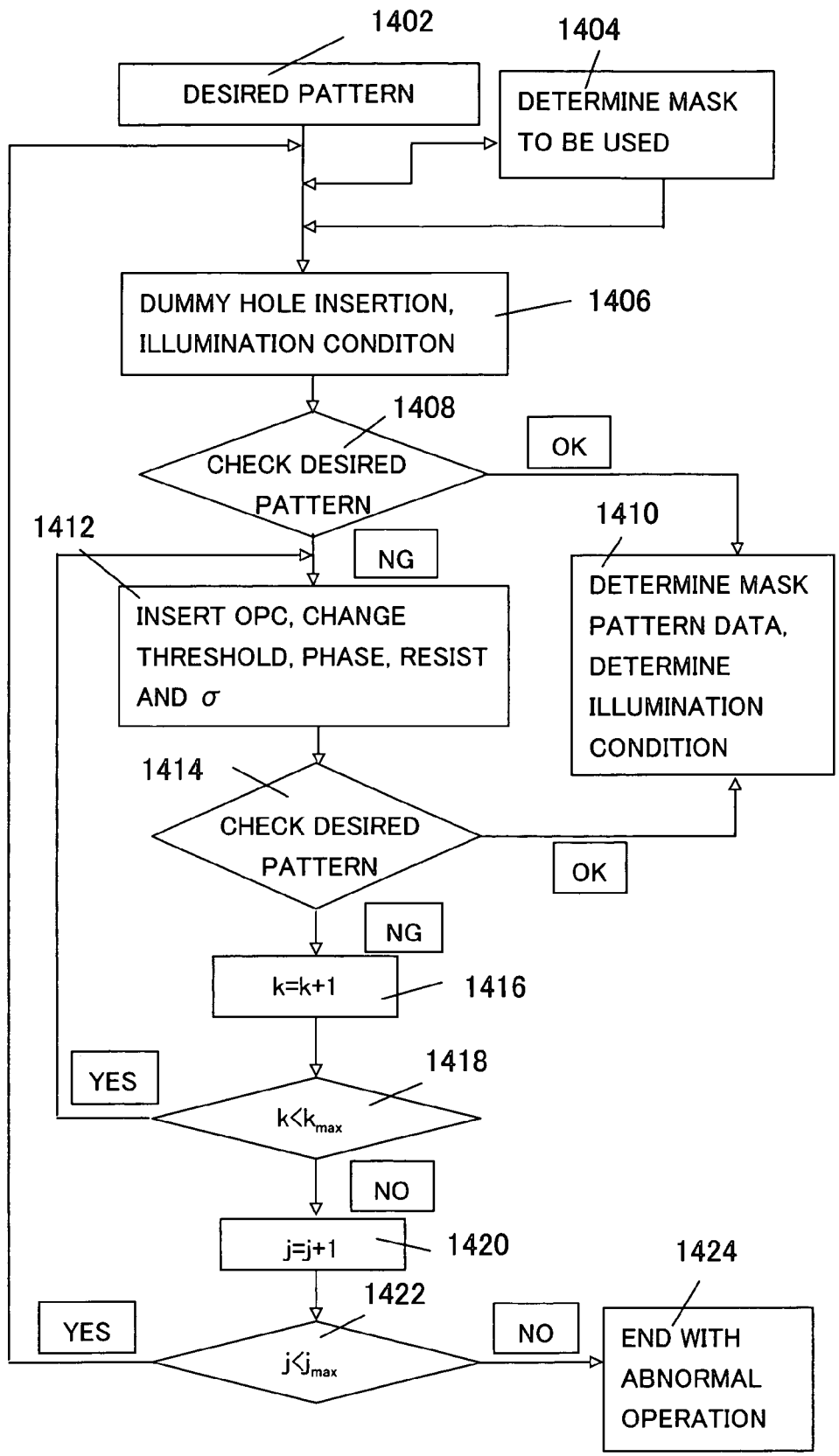
FIG. 24 is a flowchart for explaining a method of determining a mask pattern and an illumination condition according to the present invention.

Referring to FIG. 24, desired pattern data (Dpd) is prepared which assigns the transmittance of zero to an area that does not have the desired pattern and the transmittance of one to an area that has the desired pattern (step 1402). This determines a size and arrangement of a desired pattern to be exposed onto a wafer.

Then, a type of the mask (such as a binary mask, a halftone mask, a phase-shift mask, etc.) to be used is determined after the desired pattern is set (step 1404).

Figure 2A:
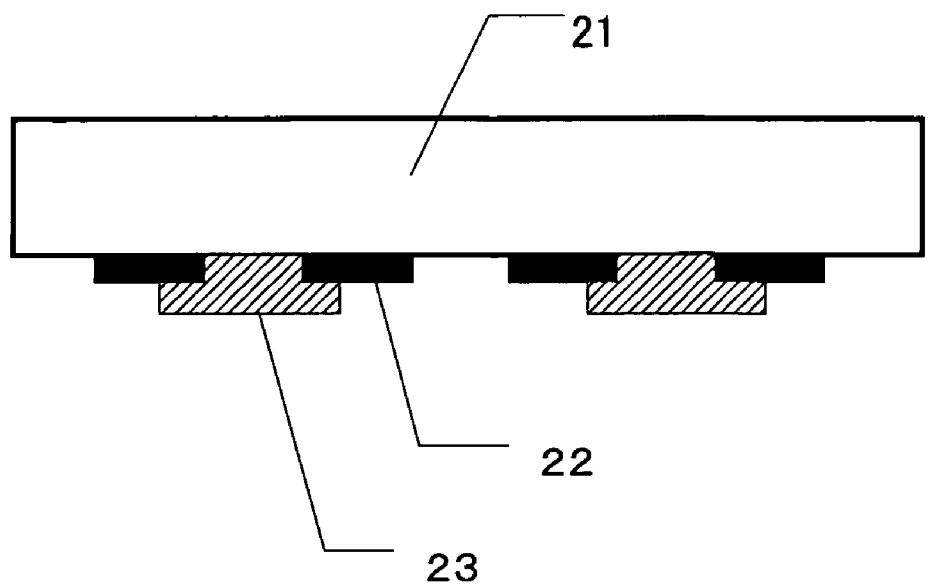
FIGS. 2A to 2C are schematic sectional views of a phase shift mask, a binary mask, and a halftone mask, respectively.
Figure 2B:
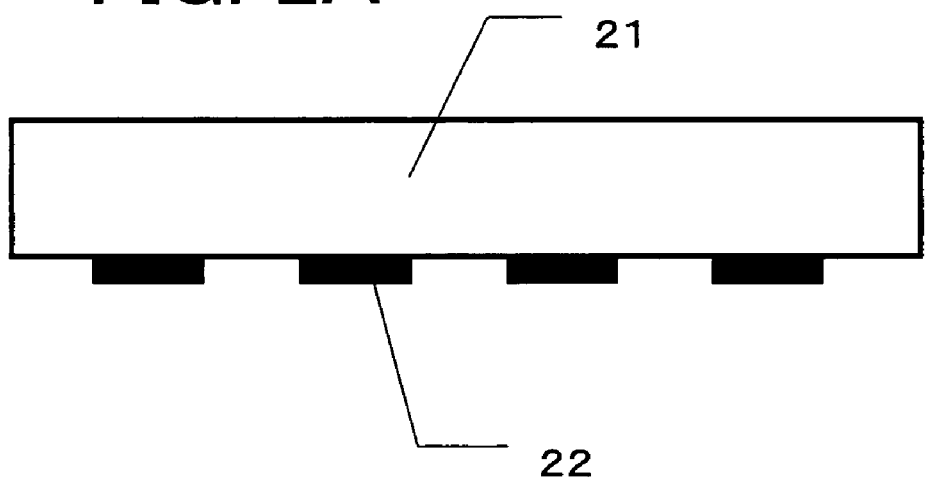
Figure 2C:
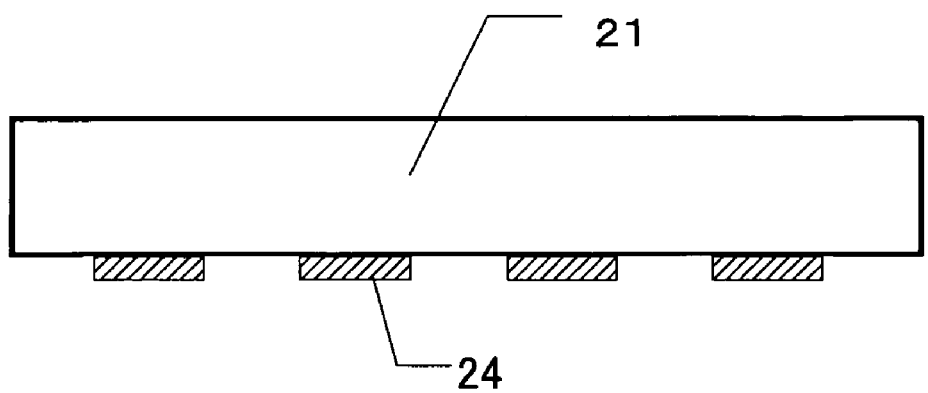

The halftone mask refers to one that modifies a corresponding binary mask such that its light-shielding portions are replaced, as schematically shown as a section in FIG. 2C, with a material 24 that attenuates light and maintains a phase difference from light-transmitting portion by 180°. An exposure apparatus currently uses a halftone mask although it is more difficult to manufacture the halftone mask than a binary mask. A phase shift mask refers to one designed to enable light incident on the mask to pass through adjacent light-transmitting portions with a predetermined phase shift, which is usually designed to be 180°. FIG. 2A is a schematic view of a sectional structure of a phase shift mask, where 23 denotes a phase shifter for creating a phase different of 180° between adjacent light-transmitting portions. Various types of phase shift masks have been proposed, and a certain type of phase shift mask can realize a critical dimension about half that for a binary mask, because the adjacent beams maintain a phase difference of 180° and cancel out an amplitude at a center portion between these beams.

Next, an auxiliary pattern or dummy contact hole pattern to be inserted, and an illumination condition are determined for data of a desired pattern (step 1406).

A determination of a size of an auxiliary pattern includes the first step of obtaining necessary dummy contact hole pattern data (Dum) based on Dpd and producing mask data (Fpd) suitable for the exposure method I, the second step of producing Dum data based on a logic operation and creating Fpd, and the third step of determining whether Fpd satisfies a mask pattern design rule. Usually, the first and/or second steps and the third step are repeated in this order if necessity arises.

The present invention is applicable whether a desired pattern is a periodic pattern or an isolated pattern. Here, the "periodic pattern" refers to one that includes at least two contact holes in one of two orthogonal directions. The "isolated pattern" refers to one that includes only one contact hole without another contact hole that forms a pair in any one of two orthogonal directions.

A determination of an illumination method performs operations, checks the illumination condition, ends when the illumination condition has been created in accordance with the design rule, and repeats a feedback to the operation step within the predetermined number of times when the illumination condition has not been created in accordance with the design rule. The step ends with an abnormal operation when determining that the created illumination condition does not pass within the predetermined number of times.

Step 1406 is also used when the procedure returns from step 1422, which will be described later, to step 1406 to correct an insertion of the auxiliary pattern and/or the illumination method.

Thereafter, the desired pattern is checked (step 1408). This step determines whether the desired pattern is formed with high precision on the basis of illumination condition data and mask pattern data produced by inserting the auxiliary pattern into the desired pattern. The step 1408 determines whether only the desired pattern may be resolved with accuracy while the dummy pattern is not resolved. Although the certain standard defines the degree of accuracy, a user may arbitrarily set that instead. With plural candidates dummy patterns and illumination conditions for resolving only the desired pattern, it is preferable to select one that leads to a larger contrast and a smaller CD (critical dimension) error deviation.

When the step 1408 determines that the desired pattern is not resolved, the desired pattern, the dummy pattern and/or another thing are corrected. The step 1406 as a result of a feedback from the step 1422, which will be described later, mainly corrects the dummy pattern and applies other correction, but step 1412 may provide any fine adjustment instead.

A correction of a desired pattern will be discussed in the optical proximity correction ("OPC") and a first example, which will be discussed later. As discussed above, the OPC is technique to transfer the desired pattern with accuracy.

Figures 25A, 25B:
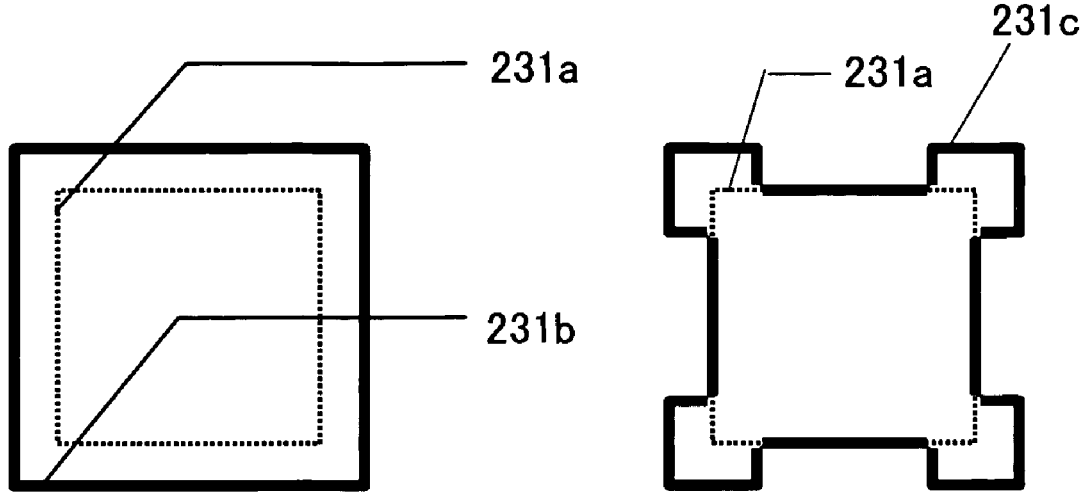
FIGS. 25A and 25B are plan views for explaining optical proximity correction.

For example, if a transferred pattern has a size smaller than a desired size, the OPC changes a mask pattern as in solid lines in FIGS. 25A and 25B in which dotted lines represent a desired hole diameter but the size of a formed hole becomes smaller than the desired size because of a relationship with exposure dose for another pattern. The OPC in FIG. 25A is effective to the low pattern density. The OPC in FIG. 25B is effective when the pattern density is high and it is difficult to enlarge a mask pattern, although the OPC in FIG. 25B increases mask data size.

A change of the size and shape of a dummy pattern would correct a desired pattern. For example, when the size of a predetermined pattern is smaller than a desired value, the size of a dummy pattern around the desired pattern is made large or the period (or pitch) of the dummy pattern is made small. On the other hand, when the size of a predetermined pattern is larger than a desired value, the size of a dummy pattern around the desired pattern is made small or the period (or pitch) of the dummy pattern is made large.

A change of the number of holes in a dummy pattern arranged around a desired pattern would correct the desired pattern. For example, the light amount of the desired pattern may be made small by reducing the number of holes in a dummy pattern arranged around a desired pattern, while the light amount of the desired pattern may be made large by increasing the number of holes in a dummy pattern.

Figure 4B:
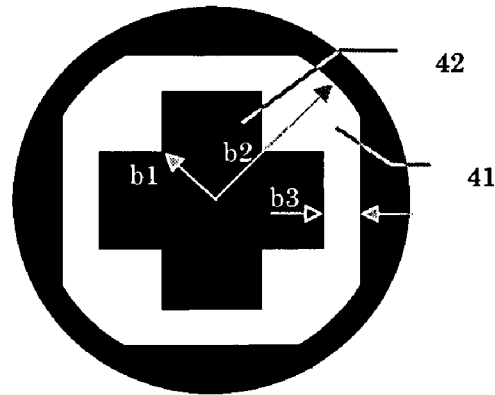
Figure 4C:
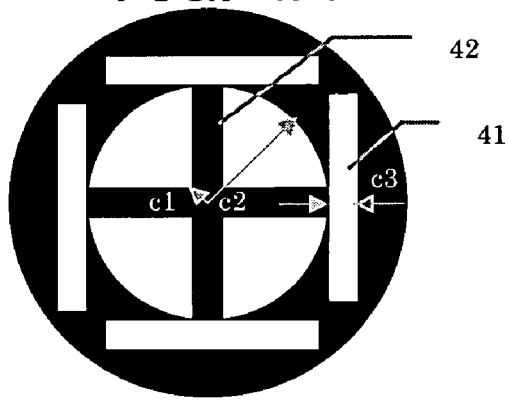
Figure 4D:
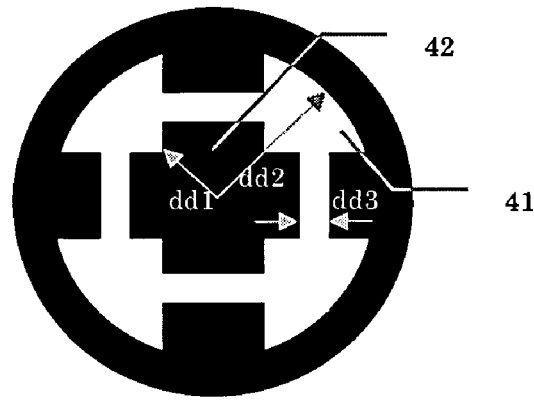
Figure 4E:
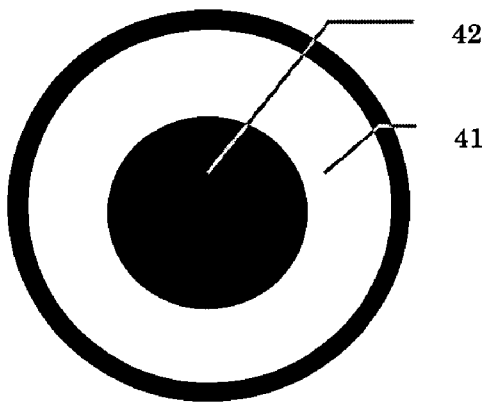
Figure 4F:
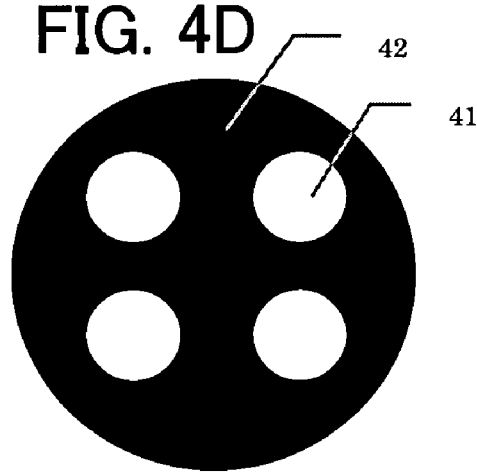

The desired pattern can also be corrected by adjusting an illumination condition. For example, when an illumination that forms an effective light source shown in FIGS. 4B to 4D is used for a binary mask, the a depth of focus can be extended from that of FIG. 4A. Other corrections are available by changing a minimum pitch, a type of a mask, a photosensitive threshold for photoresist coated on an object to be exposed, and a coherence factor σ of an effective light source. For example, a phase shift mask has effects of extending a depth of focus and slightly reducing scattering CD errors, and a change to a phase shift mask would be effective when a depth of focus is insufficient.

The desired pattern is checked again after the correction (step 1414). Similar to the step 1408, it is determined whether the desired pattern resolves with accuracy and the dummy pattern does not resolve. If it cannot still pass the step 1414, the predetermined number (kmax) of processes that is fed back to the step 1402 is repeated (steps 1416 and 1418). When it exceeds the predetermined number kmax, the process that is fed back to the step 1406 is repeated the predetermined times jmax (steps 1420 and 1422).

When the check does not pass in the step 1408 or 1414, the process ends with an abnormal operation (step 1424). When the check finally passes in the step 1408 or 1414, the mask pattern data and illumination condition are finally determined (step 1410).

Computer may execute most part of the method shown in FIG. 24, and thus once a designer prepares and inputs a pattern desired to be finally formed on the resist the computer may automatically generate the subsequent mask pattern data and illumination condition in accordance with the above procedure. Therefore, the optimal mask pattern and illumination condition may be efficiently produced even in a design of a semiconductor LSI circuit. Without a batch process of enormous mask data, the computer may conveniently divide the mask pattern data, process each divided data, and finally combine the data.

The above principle can be applied to various patterns. Some examples are described below.

FIRST EXAMPLE

A description of an optical image to be projected by a reduction projection exposure apparatus of this example with a numerical aperture NA=0.70, a reduction ratio of 4:1, and an ArF excimer laser (with an exposure wavelength λ=193 nm). This example uses a binary mask having a line pattern with a hole diameter of 100 nm and a hole interval of 100 nm.

Figure 11A:
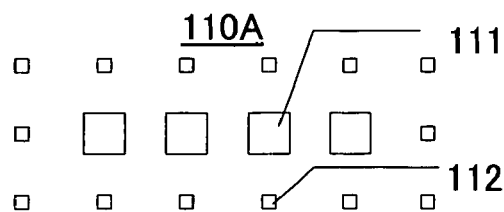
FIGS. 11A to 11F are diagrams showing mask patterns applicable to the inventive exposure method and imaging states.
Figure 11B:
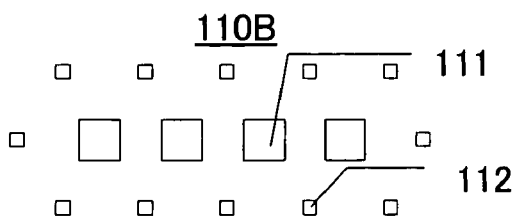

FIG. 11A schematically shows a mask 110A that sets a distance between a center of a desired pattern and a center of an auxiliary pattern to be 200 nm in the longitudinal and lateral directions, and a distance between centers of the auxiliary pattern to be 200 nm in the longitudinal and lateral directions. FIG. 11B shows a mask 110B similar to the mask 110A except for an alternate arrangement that offsets first and third lines in an auxiliary pattern to the right relative to the mask 110A, and deletes the rightmost auxiliary pattern.

Figure 11C:
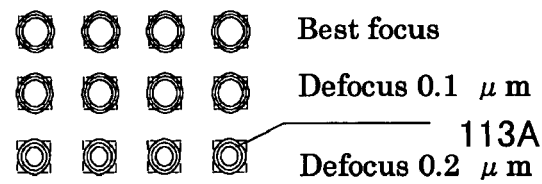
Figure 11D:
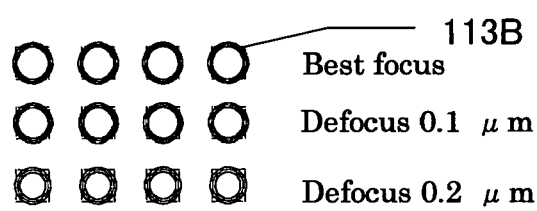

It is a binary mask, and FIGS. 11C and 11D show results obtained when the masks 110A and 110B are illuminated with a light source shown in FIG. 4A, respectively. From a comparison between FIGS. 11C and 11D, it is understood that an alternate insertion of the auxiliary pattern provides a greater light intensity on the exposure plane and a greater a depth of focus. It is also understood that an insertion of the auxiliary pattern in the longitudinal and lateral directions makes an outline of the desired contact holes 113A rhombic. On the other hand, the alternate insertion of the auxiliary pattern makes an outline of the contact holes 113B approximately circular. This is because of a difference in diffracted light distribution that contributes to patterning.

Figure 11E:
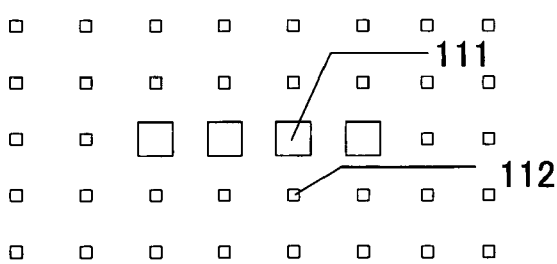
Figure 11F:
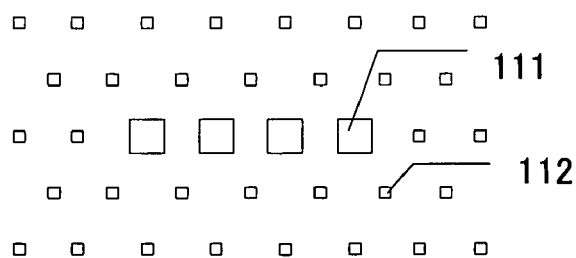

The light intensity increases when two rows of auxiliary pattern is inserted around the desired pattern as shown in FIGS. 11E and 11F. As in FIG. 11E, an alternate insertion of the auxiliary pattern provide a higher light intensity and a longer depth of focus than an insertion of the auxiliary pattern in the longitudinal and lateral directions, and thus the auxiliary pattern is preferably inserted as shown in FIG. 11F.

Thus, an alternate insertion of an auxiliary pattern can provide a good transferred pattern. While the instant example uses a binary mask, use of a halftone mask would be able to provide similar effects.

SECOND EXAMPLE

This example used a reduction projection exposure apparatus of this example with a numerical aperture NA=0.73, a reduction ratio of 4:1, and an KrF excimer laser (with an exposure wavelength $\lambda$=193 nm) to expose a pattern of rectangular contact holes on a binary mask. The alternate arrangement of the auxiliary pattern is applicable to a pattern of rectangular contact holes (or a line pattern) in addition to a pattern of square contact holes.

Figure 12A:
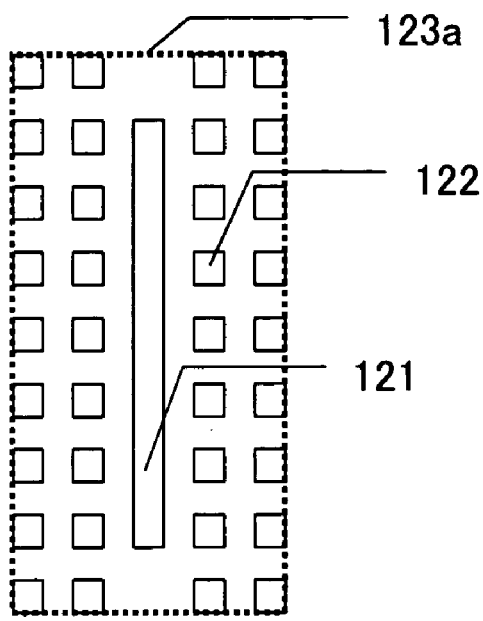
FIGS. 12A to 12C are schematic diagrams showing mask patterns applicable to the inventive exposure method.
Figure 12B:
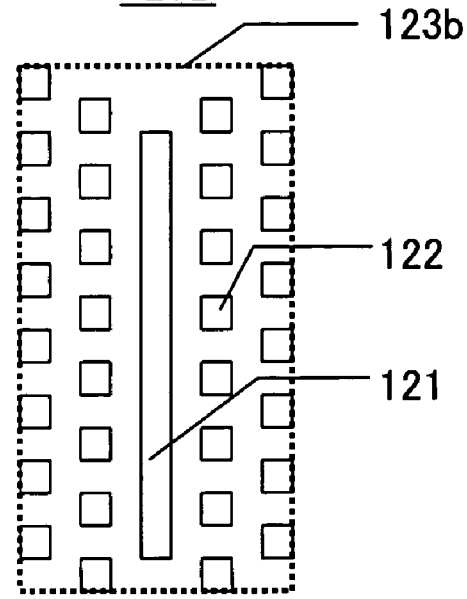
Figure 12C:
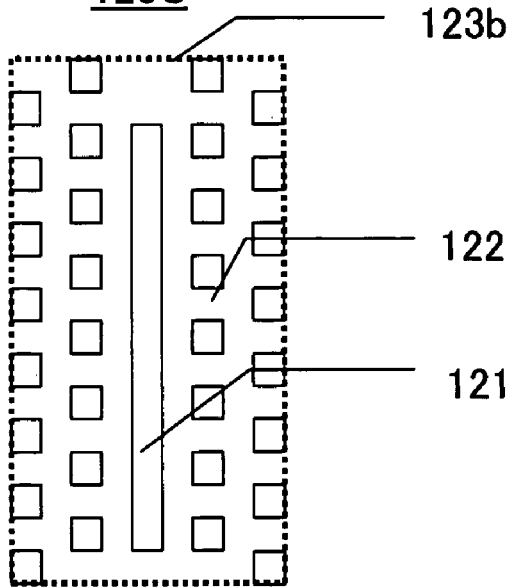

An illumination condition is one that forms an effective light source having a light intensity distribution shown in FIG. 4A, and a target pattern is a line pattern with a width of 120 nm and a length of 120×13 nm. FIG. 12A shows a mask pattern 120A that arranges an auxiliary pattern 122 regularly in the longitudinal and lateral directions. FIGS. 12B and 12C show mask patterns 120B and 120C, respectively, which alternate the auxiliary patterns. FIGS. 12A and 12C draw virtual lines in the lateral directions at intervals of 240 nm, and arrange the desired pattern 121 and the auxiliary pattern 122 on the virtual lines, although FIGS. 12B and 12C alternate the auxiliary pattern 122.

According to simulation, the mask 120A provides a width of 120.0 nm and a length of 1439.8 nm at the best focus position, while the mask pattern 120B provides a width of 120.0 nm and a length of 1443.7 nm. Understandably, this means that the alternate arrangement of the auxiliary pattern improves pattern reproducibility at the best focus position. The mask pattern 120A provides a width of 75.9 nm and a length of 1330.8 nm at a defocused position by 0.3 μm, whereas the mask pattern 120B provides a width of 78.3 nm and a length of 1342.3 nm. Understandably, this means that the alternate arrangement of the auxiliary pattern improves pattern reproducibility even at a defocused position.

Notably, the alternately arranged auxiliary pattern includes only 32 elements, whereas the normally arranged auxiliary pattern includes 36 elements. In addition, the regularly arranged mask pattern area 123a needs an area of 1080 nm×2040 nm, whereas the alternately arranged mask pattern area 123b needs a smaller area of 1080 nm×1920 nm.

The alternate arrangement of the auxiliary pattern is effective to line patterns in terms of the pattern reproducibility, the pattern area, and the number of elements in the auxiliary pattern. The masks 120B and 120C have similar effects.

Figure 13A:
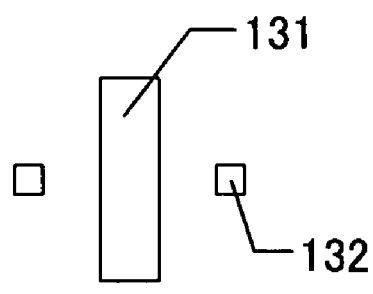
FIGS. 13A to 13D are schematic diagrams showing mask patterns applicable to the inventive exposure method.
Figure 13B:
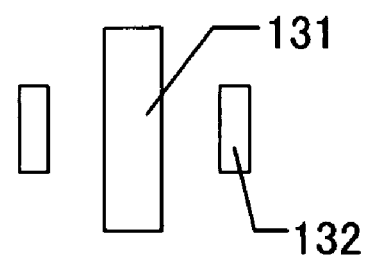
Figure 13C:
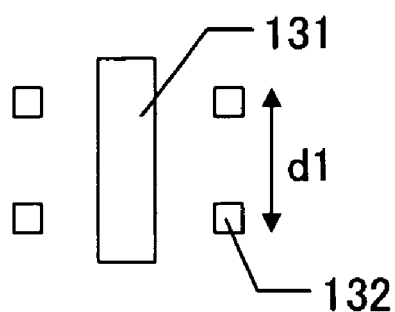
Figure 13D:
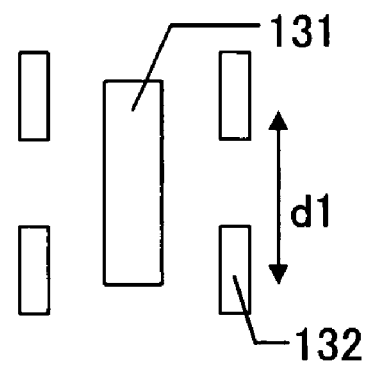

Similar effects are applicable to short line patterns. In illuminating a short line pattern on a mask with an effective light source distribution shown in FIG. 4A, it is conceivable to insert an auxiliary pattern as shown in FIGS. 13A and 13B. Even in this case, the alternate arrangement of the auxiliary pattern is applicable and, for example, auxiliary patterns may be arranged as shown in FIGS. 13C and 13D. The auxiliary pattern has an interval d1 in FIGS. 13C and 13D, which is determined by sizes of the desired and auxiliary patterns, and usually set to be a value equal to or greater than one quarter of the quotient of a wavelength divided by a numerical aperture. The instant inventors have confirmed that even one-eighth the quotient of a wavelength divided by a numerical aperture is viable if a mask can be precisely produced as designed.

This example merely exemplifies a method of inserting an auxiliary pattern into a line pattern, and the present invention is applicable to both a binary mask as in this example and a halftone mask, as well as longer or shorter line patterns than the line pattern in this example.

THIRD EXAMPLE

As described with reference to FIG. 9, an alternate pattern arrangement improves imaging performance due to differently appearing diffracted beams. This example used a binary mask as an example to study how appearances of diffracted beams change as the pattern arrangement changes.

Figure 14A:
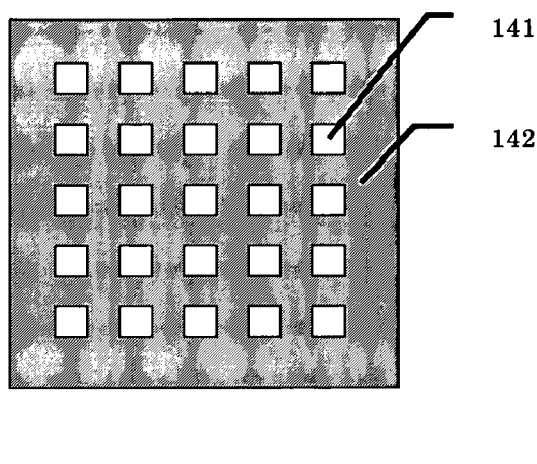
FIGS. 14A to 14B are schematic plane views of masks applicable to the inventive exposure method.
Figure 14B:
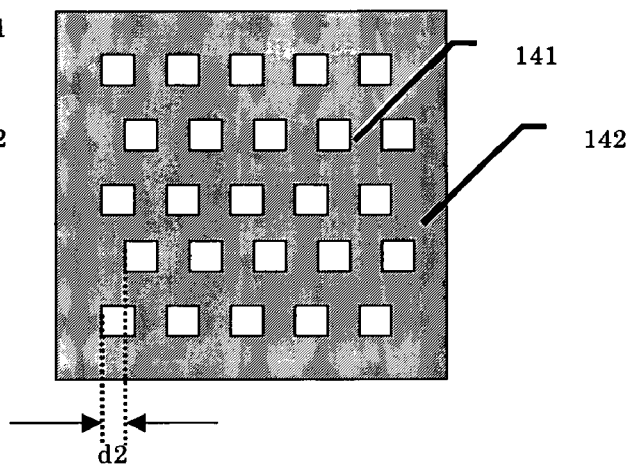

Suppose a reduction projection exposure apparatus having a numerical aperture NA=0.73, a reduction ratio of 4:1, and a KrF excimer laser (with an exposure wavelength $\lambda$=248 nm). A mask pattern shown in FIG. 14A includes a 5×5 array of 120 nm holes spaced from each other by 120 nm. A mask pattern shown in FIG. 14B modifies the mask pattern shown in FIG. 14A such that each hole in the second and fourth hole rows is laterally offset by d2 relative to the first and third hole rows.

Figure 15A:
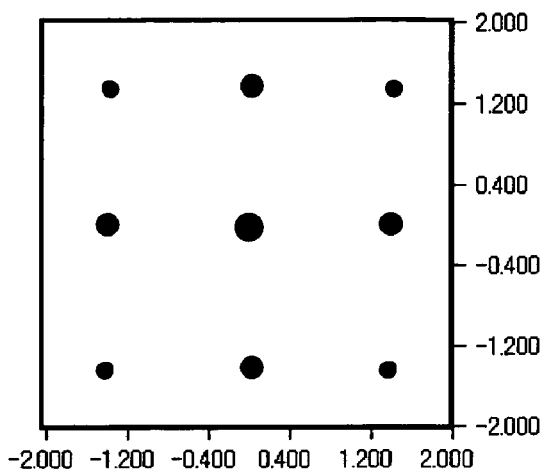
FIGS. 15A to 15D are diagrams showing distributions of diffracted light on a pupil surface, generated from the masks shown in FIGS. 14A and 14B.
Figure 15B:
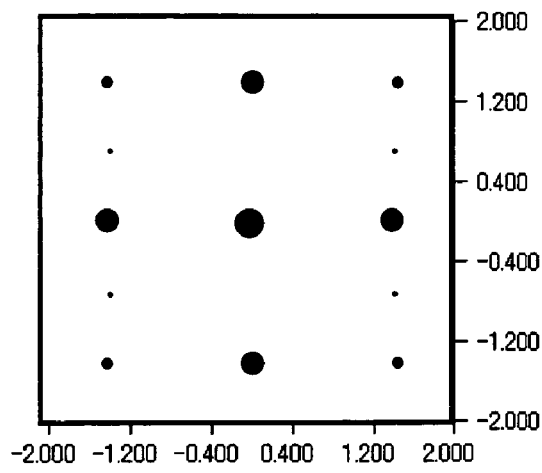
Figure 15C:
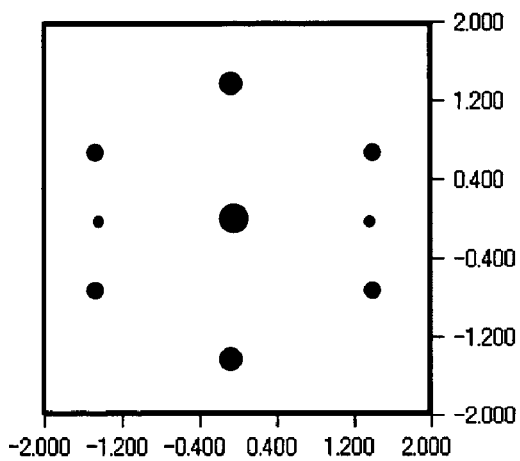
Figure 15D:
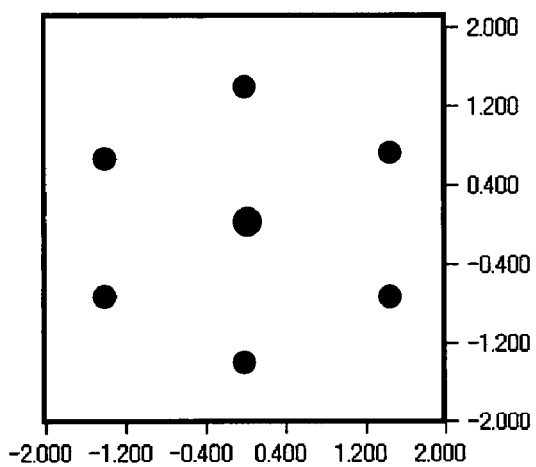

FIG. 15A shows an intensity distribution of illumination light on the pupil surface in the projection optical system, when a mask with d2=0 nm is illuminated. FIG. 15B shows an intensity distribution of illumination light on the pupil surface in the projection optical system, when a mask with d2=40 nm is illuminated. FIG. 15C shows an intensity distribution of illumination light on the pupil surface in the projection optical system, when a mask with d2=80 nm is illuminated. FIG. 15D shows an intensity distribution of illumination light on the pupil surface in the projection optical system, when a mask with d2=120nm is illuminated. The coordinate values on the pupil surface in FIG. 15 are normalized to $\lambda$/NA, a black dot indicates the diffracted beam, and a black dot size expresses the intensity of the diffracted beam.

As comparisons of four types of diffracted light distributions and intensities, it is concluded that the diffracted light has more greatly changing distributions as d2 is equal to and larger than 40 nm, and greater light intensities than that for d2 of 0 nm.

Figure 26:
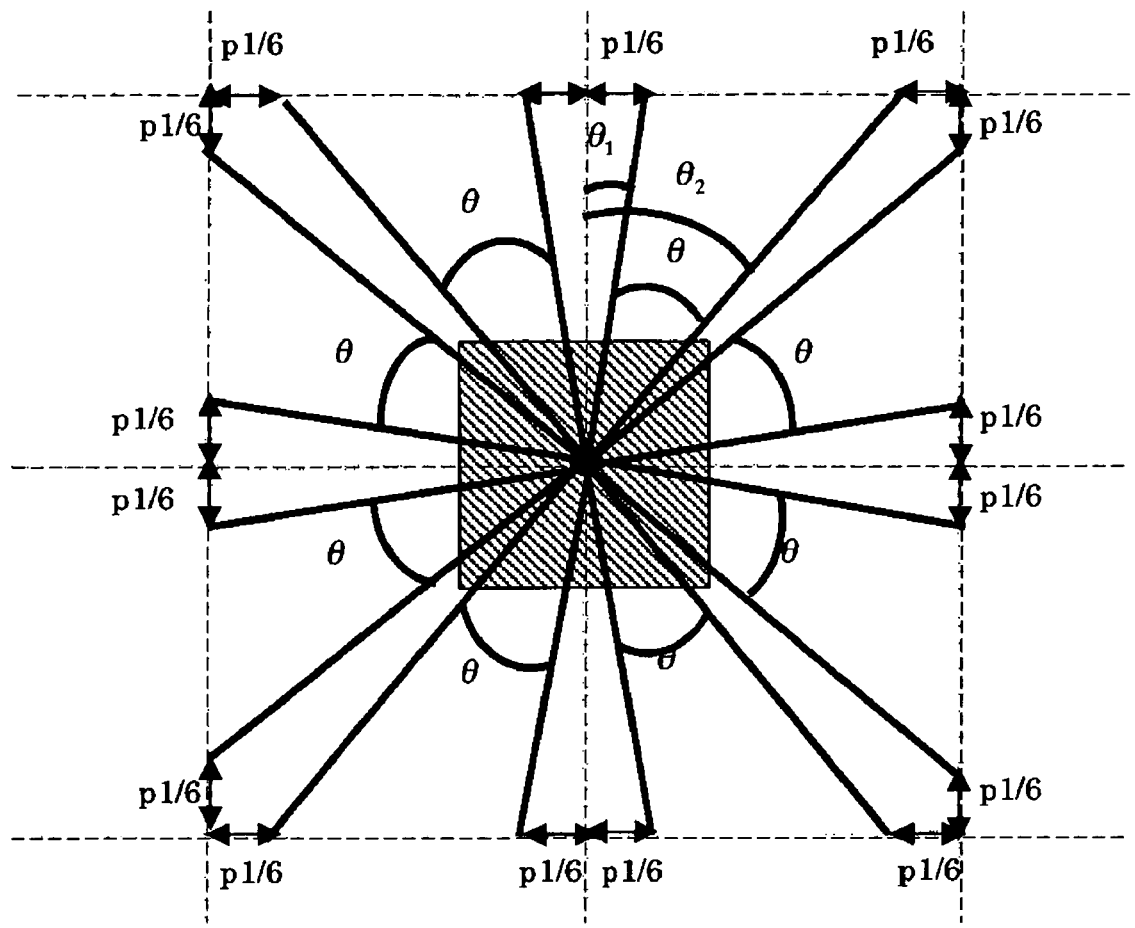
FIG. 26 is a schematic diagram of a mask pattern forming method applicable to the inventive exposure method.

In other words, an alternate arrangement of the auxiliary pattern with an offset amount in a certain direction between $P_1$/6 and $5P_1$/6 improves imaging performance, where $P_1$ is a period of the virtual lattice that can be formed from a desired pattern, when compared with the normal arrangement of the auxiliary pattern. The offset amount is more preferably between $P_1$/3 and $2P_1$/3, and most preferably approximately $P_1/2$ such that each opening of the auxiliary pattern is located at a center of two adjacent lattice points. A developed method of inserting an auxiliary pattern is clarified based on a virtual lattice: When the virtual lattice serves as an axis, a line that connects a center of a desired pattern to a center of the auxiliary pattern is within a predetermined angular range form the axis, as shown in FIG. 26. In FIG. 26, a beveled portion indicates a desired portion, while a dotted line indicates the virtual lattice. As shown in FIG. 26, this means that an angle between the axis of the virtual lattice and a line that connects a center of a desired pattern to a center of the auxiliary pattern is between $\theta_1$ and $\theta_2$, where $\theta_1$ is 9° and $\theta_2$ is 40°.

This is independent of a hole size and an exposure apparatus, and it is understood that a beam produced by an auxiliary pattern preferably include at least one of (−1, ½) diffracted light or beam, (−1, −½) diffracted light, (1, ½) diffracted light, (1, −½) diffracted light, (½, 1) diffracted light, (½, −1) diffracted light, (−½, 1) diffracted light, and (−½, −1) diffracted light.

Figure 27:
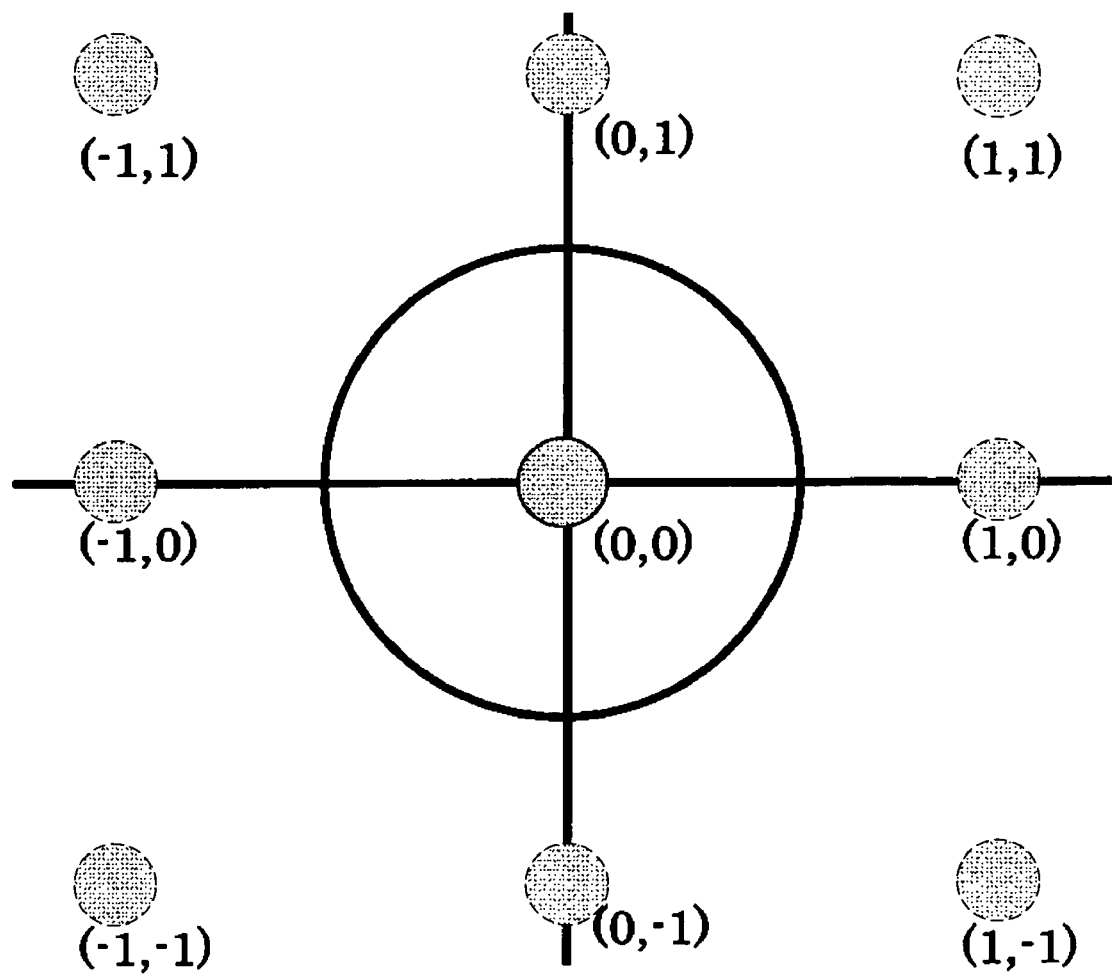
FIG. 27 is a diagram for explaining naming of diffracted beams.

Naming of the above diffracted light or beam is defined as follows:

In case of a normal arrangement of an auxiliary pattern that arranges the pattern only in the longitudinal and lateral directions, diffracted light appears like grids according to patterns' periods, as shown in FIG. 27. Diffracted light appearing at the center of the pupil is called (0, 0)(-th order) diffracted light, and diffracted light at an n-th position in the x direction and an m-th position in the y direction is called (n, m) diffracted light (where n and m an integers).

Figure 28:
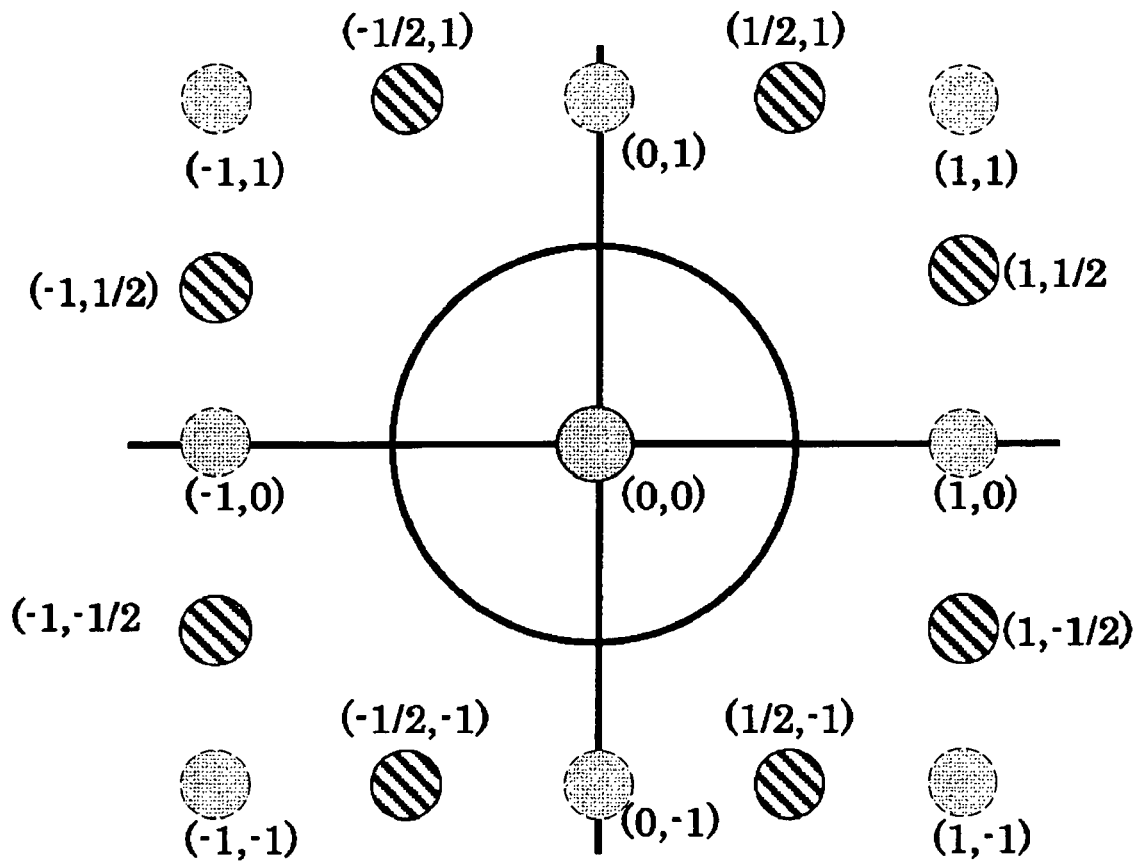
FIG. 28 is a diagram for explaining naming of diffracted beams.

In the alternate arrangement, diffracted light appears at positions different from those of the normal arrangement, as shown in FIG. 28, in particular, diffracted light appears between (n, m) diffracted light and (n, m±1) diffracted beams. The instant specification calls these diffracted beams (n, m±½) diffracted beams. Similarly, diffracted light appearing between (n, m) diffracted light and (n±1, m) diffracted beams is called (n±½, m) diffracted beams.

While this example uses a binary mask, a halftone mask can provide similar effects.

FOURTH EXAMPLE

Figure 16A:
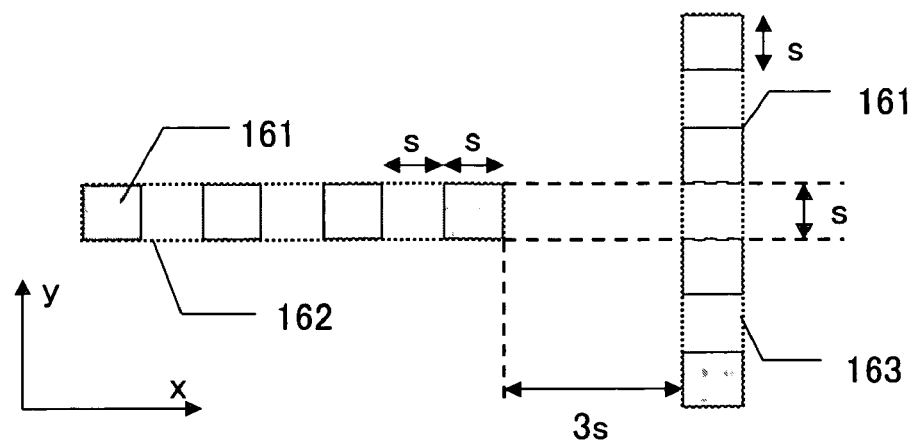
FIGS. 16A to 16C are schematic diagrams showing mask patterns applicable to the inventive exposure method.

Suppose a mask pattern that includes plural patterns each having plural aligned holes arranged. For example, as shown in FIG. 16A, a pattern 162 includes laterally arranged holes 161 with a hole diameter of "s" and a hole interval "s", and a pattern 163 includes longitudinally arranged holes 161 with a hole diameter of "s" and a hole interval of "s". An interval between the patterns 162 and 163 is 3s in the x direction, and lattice points of respective virtual lattices formed by the patterns 162 and 163 are offset by half a lattice period in the y direction. A binary or halftone mask is used with an illumination condition that forms an effective light source having a light intensity shown in FIG. 4A.

Figure 16B:
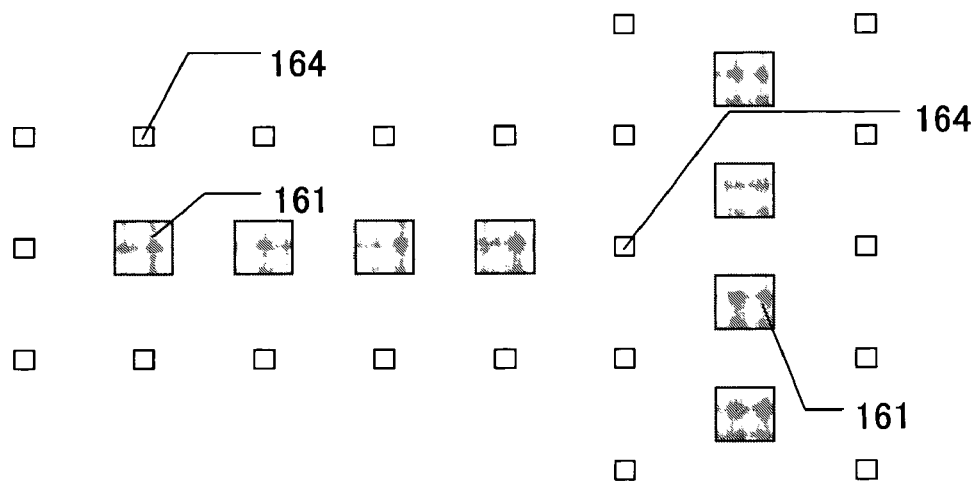

In this case, the normal arrangement of an auxiliary pattern creates a conflict between insertions of the auxiliary patterns (which is referred to as an "auxiliary pattern conflict" hereinafter). Accordingly, an auxiliary pattern is alternately inserted into one of the patterns in such combined patterns. FIG. 16 shows this example, which alternately inserts an auxiliary pattern into the pattern 163.

Figure 16C:
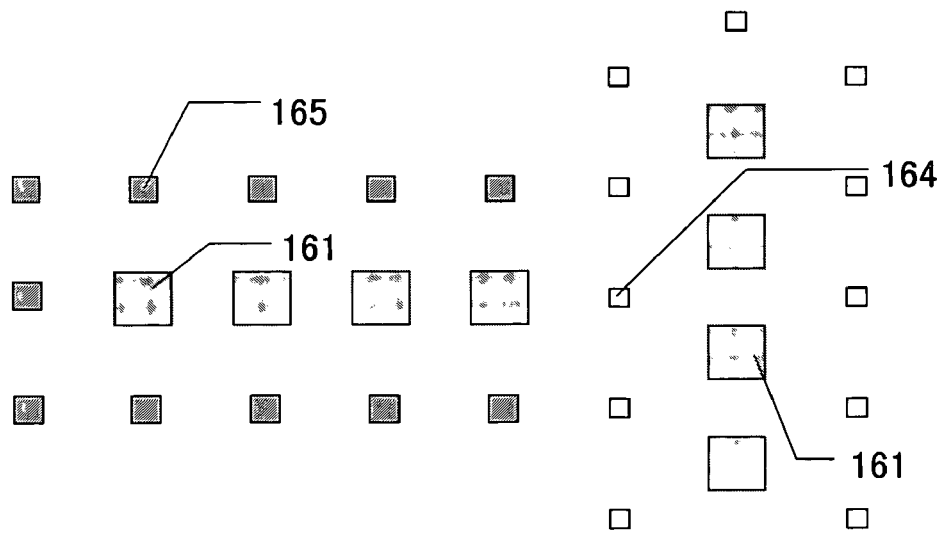

An alternate insertion of an auxiliary pattern provides high light intensity, which may in discordance with the light intensity resulting from the normal arrangement of the auxiliary pattern. In this case, an area of an auxiliary pattern around the normally arranged auxiliary pattern is made slightly larger, as shown in FIG. 16C. FIG. 16C shows two types of auxiliary patterns 164 and 165, wherein the size of the auxiliary pattern 164 is smaller than that of the auxiliary pattern 165. More specifically, for an optical image to be projected by a reduction projection exposure apparatus with a numerical aperture NA=0.70, a reduction ratio of 4:1, and an ArF excimer laser (with an exposure wavelength $\lambda$=193 nm), which has a row of holes with a hole diameter of 100 nm and a hole interval of 100 nm, for example, a size of the auxiliary pattern 165 may be set greater by about 5 to 10 nm than the auxiliary pattern 164. The auxiliary pattern is varied by a size corresponding to 5 to 10% of a desired pattern or by an area of 10% to 30%.

This example corrects scattering sizes of the desired pattern on the wafer by changing a size of an auxiliary pattern.

Alternatively, instead of changing a size of an auxiliary pattern, scattering sizes of a desired pattern on a wafer can be reduced by changing sizes of a desired pattern into various sizes.

For example, a size of a desired pattern on a mask enclosed by normally arranged auxiliary pattern may be enlarged by about 1 nm to about 7 nm in the exposure condition. Conversely, a size of a desired pattern on a mask enclosed by alternately arranged auxiliary pattern may be reduced by about 1 nm to about 7 nm. Of course, the above method of varying a size of an auxiliary pattern can be used together.

FIFTH EXAMPLE

Figure 17A:
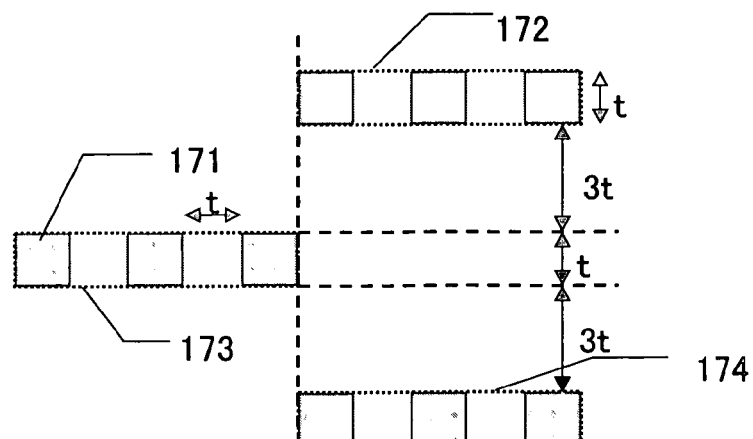
FIGS. 17A to 17C are schematic diagrams showing mask patterns applicable to the inventive exposure method.

Suppose a mask pattern that includes a combination of a plurality of linear arrays of holes. Referring to FIG. 17A as an example, there are patterns 172, 173 and 174 that form a linear array of holes 171 with a hole diameter of "t" and a hole interval "t". An interval between the patterns 173 and 172 is 0 in the x direction and an interval between them is 3t in the y direction. An interval between the patterns 173 and 174 is 0 in the x direction, and an interval between them is 3t in the y direction. A binary or halftone mask is used with an illumination condition that forms an effective light source having a light intensity shown in FIG. 4A.

Figure 17B:
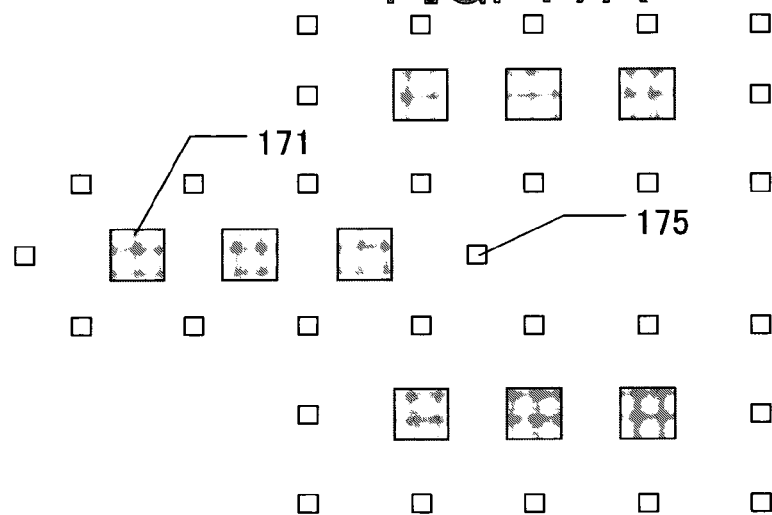

In this mask pattern arrangement, a normal arrangement of an auxiliary pattern creates an "auxiliary pattern conflict". A normal arrangement of an auxiliary pattern and an alternate arrangement of an auxiliary pattern may be combined, as shown in FIG. 17B. FIG. 17B alternately inserts an auxiliary pattern into a pattern 173, and normally inserts an auxiliary pattern into patterns 172 and 174.

Figure 17C:
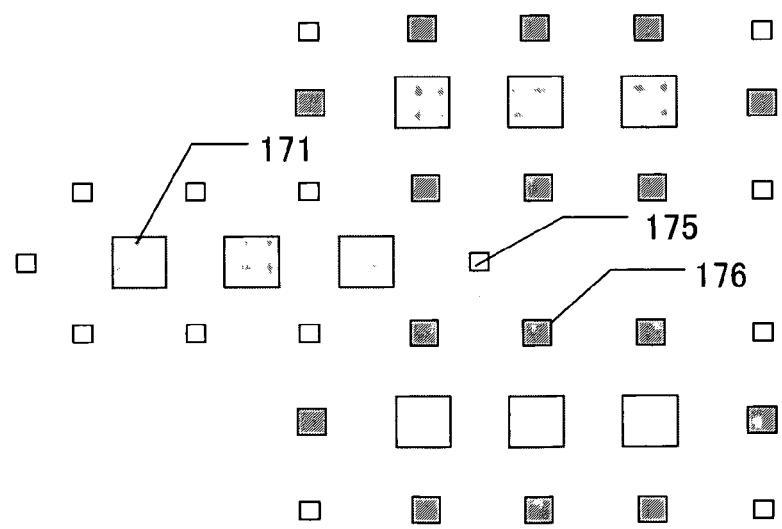

An alternate insertion of an auxiliary pattern provides high light intensity, which may in discordance with the light intensity resulting from the normal arrangement of the auxiliary pattern. In this case, an area of an auxiliary pattern around the normally arranged auxiliary pattern is made slightly larger, as shown in FIG. 17C. FIG. 17C shows two types of auxiliary patterns 175 and 176, wherein the size of the auxiliary pattern 175 is smaller than that of the auxiliary pattern 176. More specifically, for an optical image to be projected by a reduction projection exposure apparatus with a numerical aperture NA=0.70, a reduction ratio of 4:1, and an ArF excimer laser (with an exposure wavelength $\lambda$=193 nm), which has a row of holes with a hole diameter of 100 nm and a hole interval of 100 nm, for example, a size of the auxiliary pattern 176 may be set greater by about 5 to 10 nm than the auxiliary pattern 175. An auxiliary pattern is varied by a size corresponding to 5 to 10% of a desired pattern or by an area of 10% to 30%.

SIXTH EXAMPLE

Figure 18A:
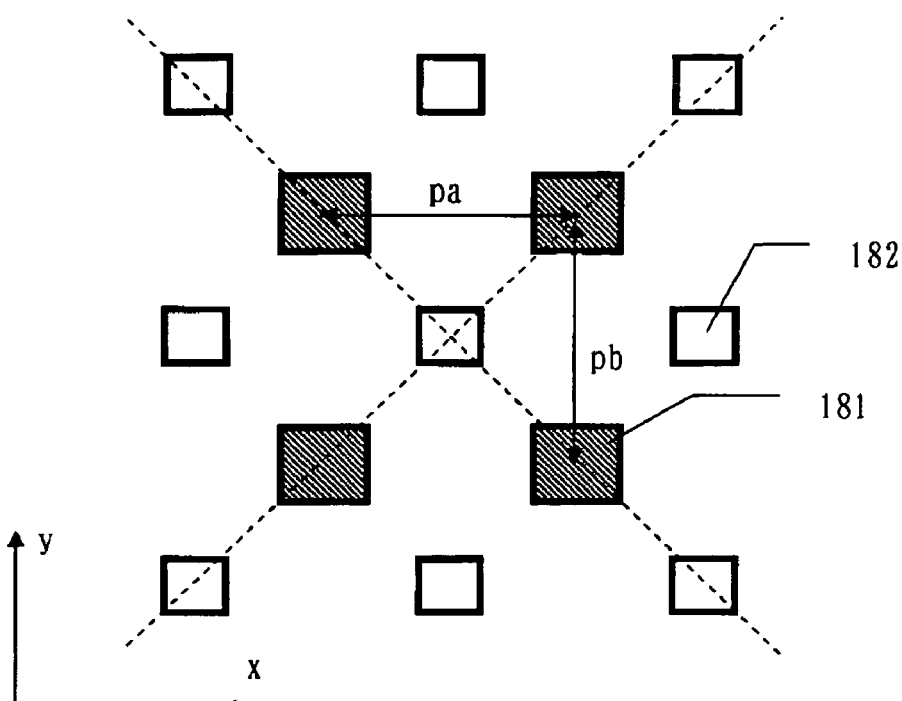
FIGS. 18A and 18B are schematic diagrams showing mask patterns applicable to the inventive exposure method.
Figure 18B:
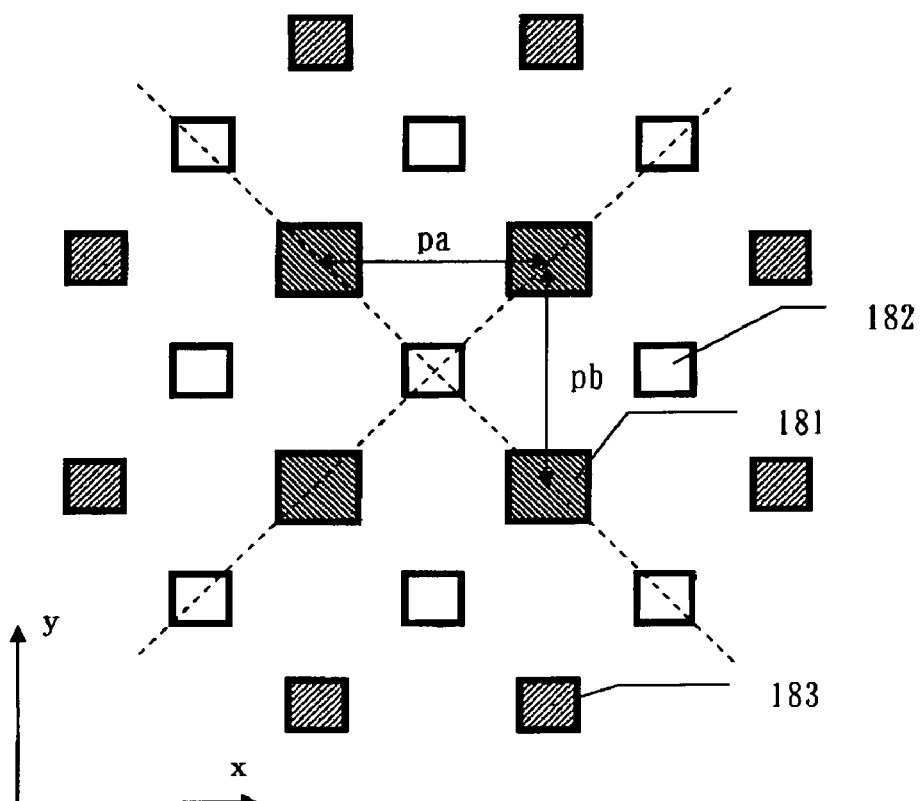

Referring to FIGS. 18A and 18B, a description will be given of an application of an alternate arrangement of an auxiliary pattern. In FIG. 18A, a pattern 181 is a desired pattern, and arranged at respective vertices of a virtual rectangle in a virtual lattice. The virtual rectangle has a length "pa" in the x direction, and a length "pb" in the y direction. The lengths "pa" and "pb" are too small to insert an auxiliary pattern but has much smaller light intensity than another dense pattern if no auxiliary pattern is inserted into them. Accordingly, an auxiliary pattern may be arranged on or near an intersection between diagonals in the virtual rectangle to provide a periodicity in the diagonal directions. Specifically, this is true of a case where "pa" and "pb" are between 0.5×λ/NA and 1.0×λ/NA where λ is an exposure wavelength and NA is a numerical aperture of the projection optical system. Note that pa and pb are not limited to the above range.

In this case, an auxiliary pattern 182 may be periodically inserted into a middle of a diagonal period of a desired pattern to provide periodicity in that direction. This is an illustrative application of an alternate arrangement of an auxiliary pattern. When a binary or halftone mask is used, an illumination condition may form an effective light source having a light intensity distribution shown in FIG. 4A.

The above pattern may add a normal arrangement of an auxiliary pattern, as shown in FIG. 18B. FIG. 18B normally arranges an auxiliary pattern 183 as a virtual rectangular pattern in longitudinal and lateral directions, and alternately arranges an auxiliary pattern 182 in the above manner.

An arrangement of an auxiliary pattern could round a desired pattern, and increase the light intensity.

SEVENTH EXAMPLE

Figure 19A:
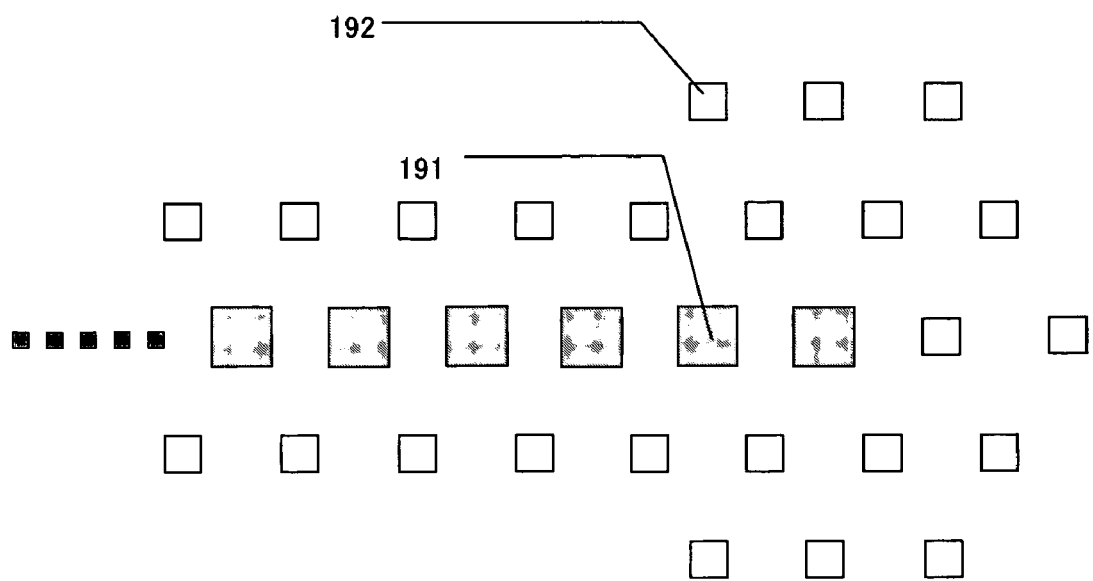
FIGS. 19A and 19B are schematic diagrams showing mask patterns applicable to the inventive exposure method.
Figure 19B:
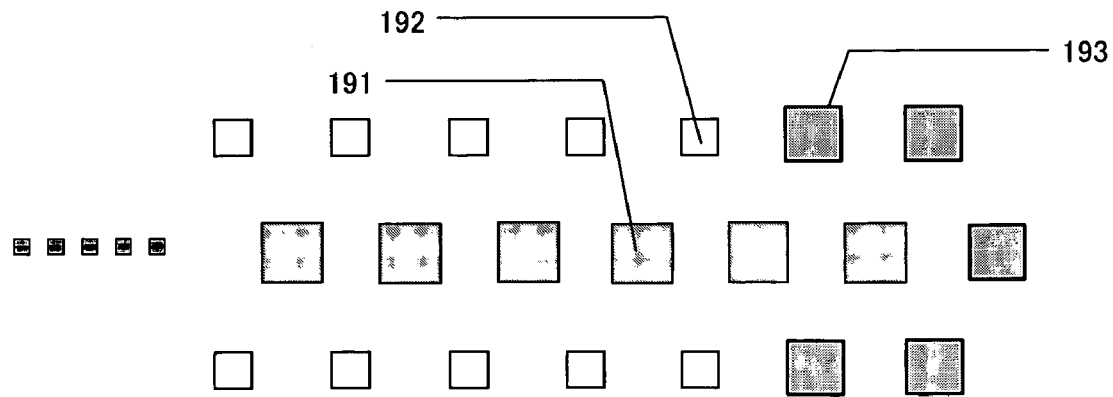

Suppose that holes are aligned with each other. FIG. 19A shows a method of inserting an auxiliary pattern 192 into a right end part of a linear array of a large number of holes. This method basically inserts the auxiliary pattern 192 alternately around a desired pattern 191, but would cause a drop of light intensity at edges. Accordingly, it is preferable to add more auxiliary patterns at pattern edges than other parts. The additional auxiliary pattern should be alternately arranged. FIG. 19A shows a thus-obtained mask pattern.

FIG. 19A shows another method of inserting an auxiliary pattern 192 into a right end part of a linear array of a large number of holes. This method basically inserts the auxiliary pattern 192 alternately around a desired pattern 191, but would cause a drop of light intensity at edges. Accordingly, for example, for an optical image to be projected by a reduction projection exposure apparatus with a numerical aperture NA=0.70, a reduction ratio of 4:1, and an ArF excimer laser (with an exposure wavelength λ=193 nm), which has a row of holes with a hole diameter of 100 nm and a hole interval of 100 nm, a size of the auxiliary pattern 193 to be inserted into pattern edges may be set greater by about 5 to 10 nm than the other auxiliary patterns. The auxiliary pattern is varied by a size corresponding to 5 to 10% of a desired pattern or by an area of 10% to 30%.

As required, a desired pattern can be formed with precision by varying the number of auxiliary patterns to be inserted according to locations, varying a size of the auxiliary pattern, or varying both the number and the size. When a binary or halftone mask is used, an oblique incidence illumination is the most effective, such as those having effective light source distributions with dark center portions shown in FIGS. 4A to 4E.

EIGHTH EXAMPLE

The instant inventors have discovered an appropriate illumination condition to increase a depth of focus in the exposure method I. A description will now be given of a concrete shape of an effective light source distribution.

Figure 20:
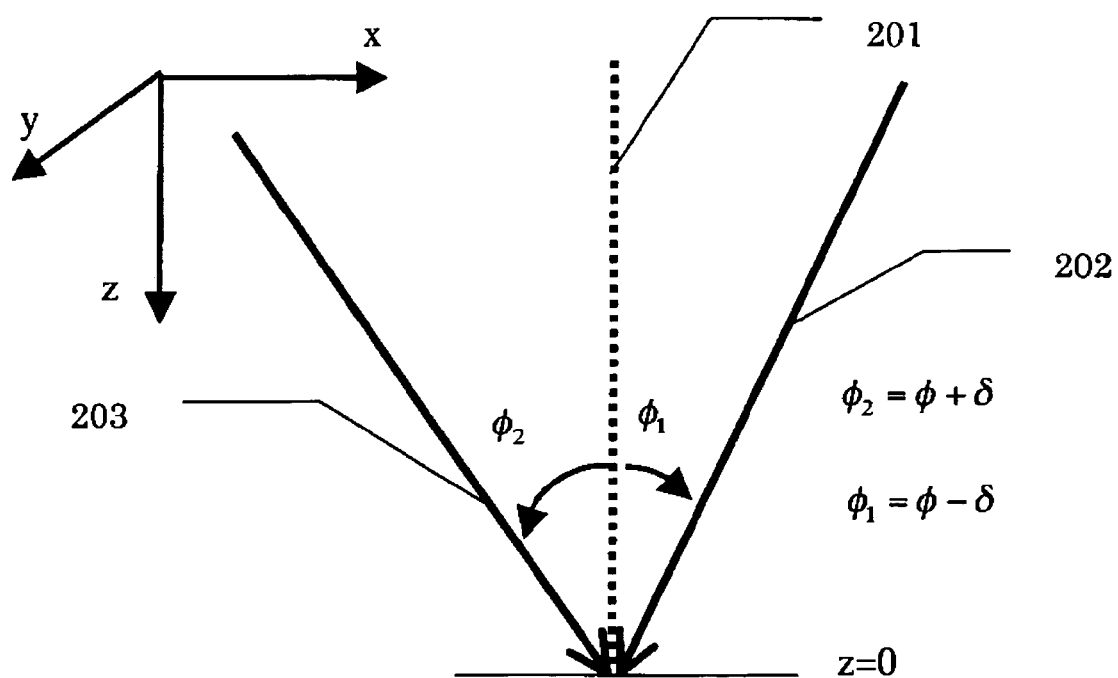
FIG. 20 is a schematic view for explaining two-beam interference.

The inventive principle will be described with reference to FIG. 20. FIG. 20 shows a so-called two-beam interference, or interference on Z=0 between a certain plane wave 202 incident at an angle of Φ1 relative to an optical axis 201, and a certain incident plane wave 203, where Φ1=Φ−δ and Φ2=Φ+δ. Then the light intensity distribution I(x) at z=0 can be given by the following equation 2:

$$I(x,z)=2[1+\cos\{4\pi/\lambda(\sin\Phi\cos\delta x-\sin\Phi\sin\delta z)\}] \quad (2)$$

If Φ1=Φ2, then δ=0 and I(x, z) does not depend upon z. A depth of focus theoretically becomes infinite. However, if Φ1 is not Φ2, then δ has a value and I(x, z) depends upon z. I(x, z) has iterative dependency upon z given by the following equation:

$$P=\lambda/(2\sin\Phi\sin\delta) \quad (3)$$

As a consequence, a depth of focus increases as δ decreases or as a difference between (Φ1 and Φ2 becomes smaller.

From the above principle and the effect of the oblique incidence illumination, it is understood that effective light source distributions shown in FIGS. 4B, 4C and 4D as an improvement of an effective light source distribution shown in FIG. 4A can extend a depth of focus for a binary or halftone mask. A key point of the improvement is to provide an elongated light intensity distribution in the longitudinal and lateral directions of the illumination. In view of the instant inventors' experiences, the fly-eye lens's influence and light intensity, b3, c3 and dd3 in FIG. 4 that define elongated longitudinal and vertical light intensity distributions should be set between about 0.05 and about 0.15 when converted into σ of the illumination.

In particular, a shape can be easily determined for a mask pattern with a strong periodicity as follows: A factor $k_1$ is given as p×NA/λ, where p is a pattern's half pitch, NA is a numerical aperture of a projection optical system, and λ is a wavelength. Then, a shape of an effective light source distribution has a center of $1/1/(4 \times k_1)$ when σ-converted, and b3, c3 and dd3 may be 0.1.

A description will be given of a more detailed shape of an effective light source having an outline shown in FIG. 4B, 4C or 4D. A shape shown in FIG. 4B is effective when 0.3≦b1≦b2<1.0. A shape shown in FIG. 4C is effective when 0.1≦c1≦c2<0.9. A shape shown in FIG. 4D is effective when 0.3≦dd1≦dd2<1.0. An actual exposure apparatus seldom guarantees σ up to 1, but it is practically regarded to guarantee σ of 1 or greater by reducing NA.

NINTH EXAMPLE

Figure 21A:
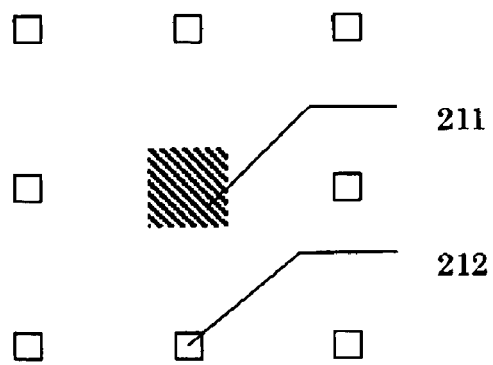
FIGS. 21A and 21B are schematic diagrams showing mask patterns applicable to the inventive exposure method.
Figure 21B:
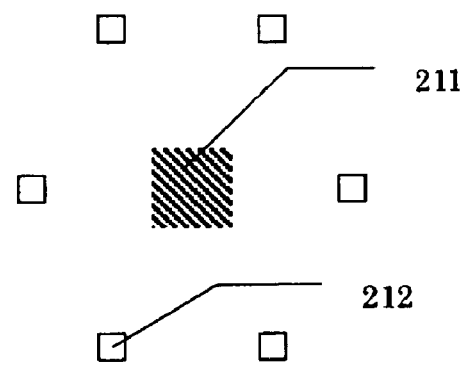

Suppose a method of inserting an auxiliary pattern into an isolated hole. Conceivably, an auxiliary pattern 212 is inserted around a desired pattern 211 in longitudinal and lateral directions, as shown in FIG. 21A. In contrast, the instant example alternately inserted an auxiliary pattern 212 around a desired pattern 211, as shown in FIG. 21B. As a result of an illumination under an illumination condition in accordance with a mask, it was found that FIG. 21B provided better performance in depth of focus and exposure dose than FIG. 21A. Thus, the present invention is applicable to an isolated pattern. In order to apply the present invention to an isolated pattern, an alternate arrangement is used after the isolated pattern is placed on a proper virtual lattice. This method basically sets a half cycle of a virtual lattice to a hole diameter of the isolated pattern, or to a period of any slightly distant periodic pattern.

Figure 22A:
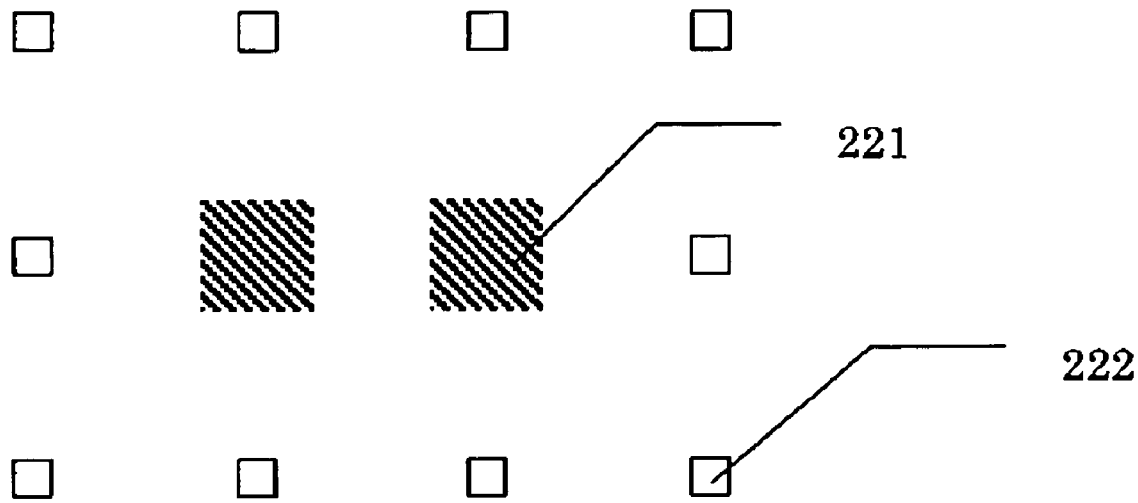
FIGS. 22A and 22B are schematic diagrams showing mask patterns applicable to the inventive exposure method.
Figure 22B:
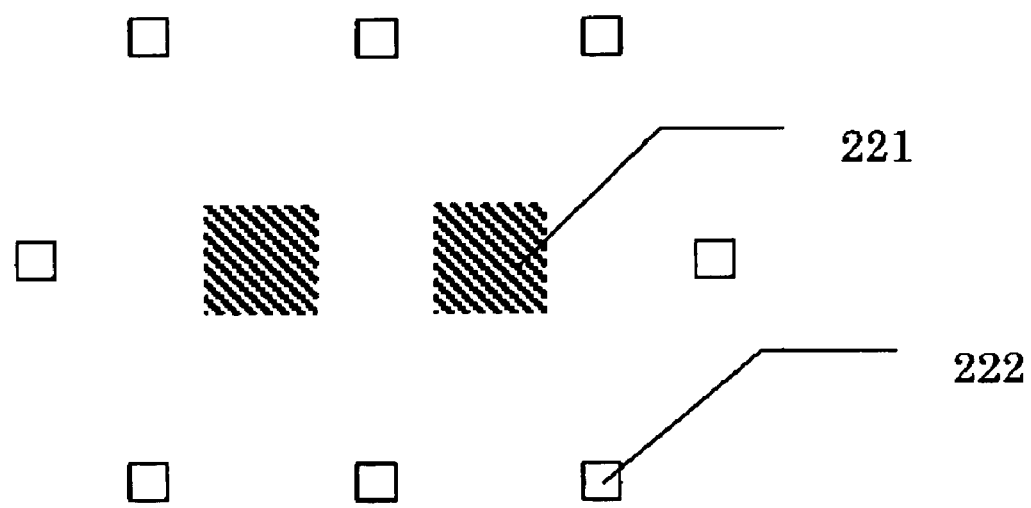

The present invention is also applicable to an arrangement of two holes. Conceivably, an auxiliary pattern 222 is arranged around a desired pattern 221 in the vertical and lateral directions, as shown in FIG. 22A. In contrast, this example assumed a virtual lattice that includes two holes, and alternately arranged an auxiliary pattern 222. As a result of use of a proper oblique incidence illumination, it was found that FIG. 22B provided better performance in depth of focus and exposure dose than FIG. 22A. Thus, the present invention is applicable to an arrangement of two holes.

The present invention is similarly applicable to an arrangement of three or more holes.

TENTH EXAMPLE

Figure 29:
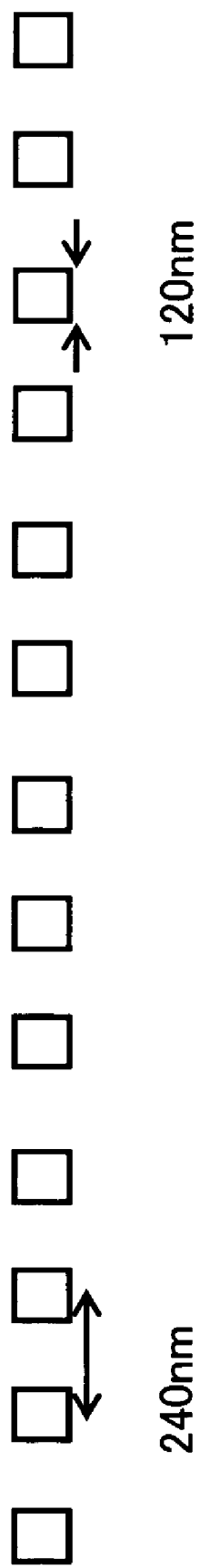
FIG. 29 is a view of an arrangement of a pattern.

This example uses an exposure apparatus with a numerical aperture of 0.73 and KrF (with a wavelength of 248 nm) to expose thirteen aligned, 120 nm contact holes spaced from each other by 120 nm, as shown in FIG. 29. FIG. 29 is a view of an arrangement of a contact hole pattern (or a desired pattern).

It uses a halftone mask or an attenuated phase shift mask that has a light-transmitting portion at a pattern part, and used for a non-pattern part a material that has transmittance of about 6% and maintains a phase difference of 180° from light that has passed through the light-transmitting portion.

Since a pattern period in a lateral direction is 240 nm, a virtual lattice having a period of 240 nm in a longitudinal direction, i.e., having periods of 240 nm in the longitudinal and lateral directions is assumed. An auxiliary pattern having a size of 90 nm is arranged at a lattice point.

Figure 30:
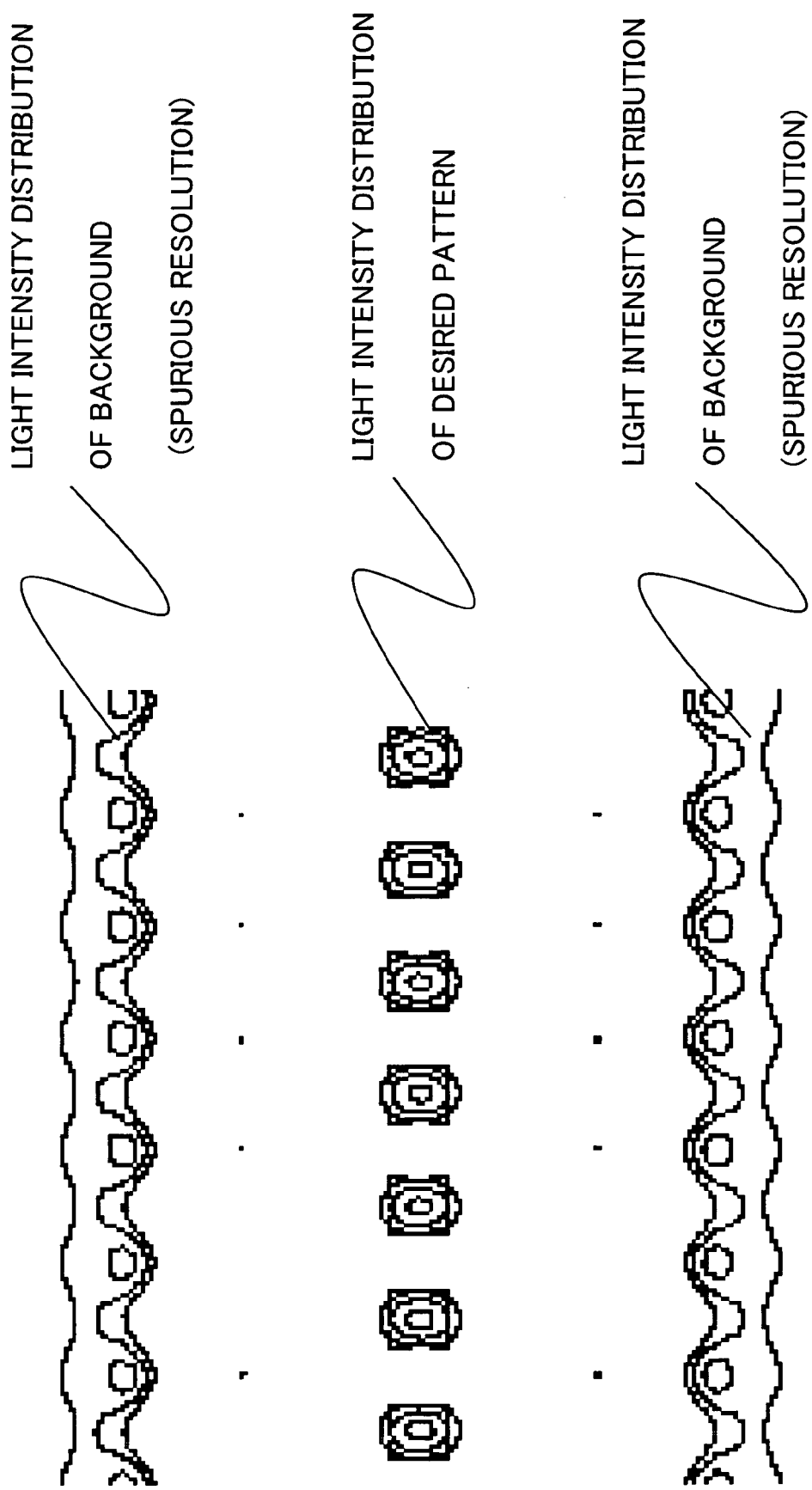
FIG. 30 is a contour of light intensity distribution of an aerial image on a wafer surface.

A result was obtained as shown in FIG. 30 with an illumination mode with an effective light source shape shown in FIG. 4A for exposure. FIG. 30 is a contour that indicates a light intensity distribution of an aerial image on a wafer surface.

Figure 31:
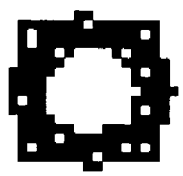
FIG. 31 is a contour of light intensity distribution of an aerial image on a wafer surface.
Figure 31:
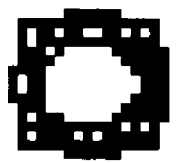
Figure 31:
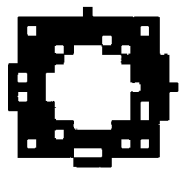
Figure 31:
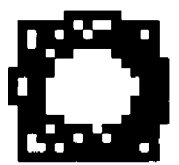
Figure 31:
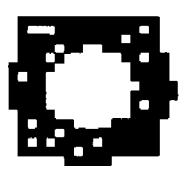
Figure 31:
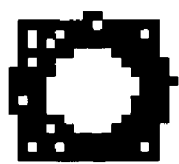
Figure 31:
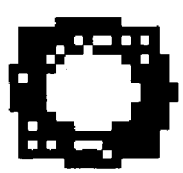

As understood in view of a result shown in FIG. 30, the light intensity of the desired pattern is approximately the same as that of the background, and the desired pattern cannot be resolved. Even an alternate arrangement of the auxiliary pattern cannot change the result, and cannot resolve the desired pattern. Accordingly, a normal arrangement was provided which set a size of the light-transmitting portion corresponding to the desired pattern to be 140 nm without changing a period of a virtual lattice (i.e., while maintaining the space to be 100 nm), and set a size of an auxiliary pattern to 110 nm. Then the light intensity of the desired pattern became larger than that of the background, and the desired pattern resolved. FIG. 31 shows this result. FIG. 31 is a contour that indicates a light intensity distribution of an aerial image on a wafer surface.

Similarly, an alternate arrangement of an auxiliary pattern with a size of the desired pattern of 140 nm and a size of the auxiliary pattern of 110 nm enabled the desired pattern to resolve.

From the above result, it was found that use of a halftone mask requires a desired pattern size on a mask to be greater to some extent than a size of a pattern corresponding to a pattern size to be transferred on a wafer (i.e., a size times a magnification of the projection optical system in an exposure apparatus).

Figure 32:
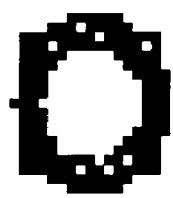
FIG. 32 is a view showing an exposure result.
Figure 32:
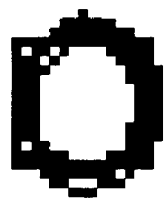
Figure 32:
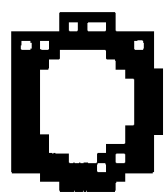
Figure 32:
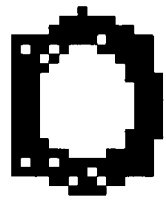
Figure 32:
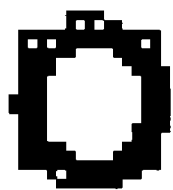
Figure 32:
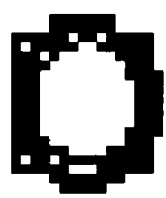
Figure 32:
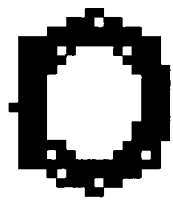

However, an excessively large size disadvantageously makes the pattern dense and an insertion of an auxiliary pattern difficult, and deforms a desired pattern itself due to influence of close pattern. For example, FIG. 32 shows a result of a desired pattern of 180 nm and an auxiliary pattern 150 nm. This is marginal, but it is understood that a hole is slightly oblong. This corresponds to a reduction of contrast.

In conclusion, when a halftone mask has a desired pattern and an auxiliary pattern smaller than the desired pattern, it is understood that the desired pattern has a size corresponding to 120% to 150% of a size corresponding to a size to be formed on a substrate or wafer.

Next, a mask used a binary mask. The exposure method proposed by the present invention is characterized in forming a periodic pattern. In this case, a light intensity ratio between mutually interfering diffracted beams affects the contrast of an aerial image. Of course, the contrast increases, as a light intensity ratio between interfering diffracted beams becomes close to 1. In a binary mask, the light intensity of 0-th order light is stronger than that of 1-st order light. In order to make the light intensity of 1-st order light close to the light intensity of 0-th order light, a size of a predetermined pattern on a mask may be made smaller than a pattern size to be transferred. As a result, the contrast of the aerial image increases. Suppose that an exemplary contact hole pattern shown in FIG. 29 is exposed.

The contrast of a center hole in a lateral direction was about 36% when estimated from an aerial image from a mask that sets a desired pattern size as 120 nm, and an auxiliary pattern size of 90 nm. On the other hand, the contrast of a center hole in a lateral direction was about 31% when estimated from an aerial image from a mask that sets a desired pattern size as 140 nm, and an auxiliary pattern size of 110 nm.

Thus, it was found that use of a binary mask requires, contrary to the above halftone mask, a desired pattern size on a mask to be smaller than a size of a pattern corresponding to a pattern size to be transferred on a wafer (i.e., a size times a magnification of the projection optical system in an exposure apparatus), so as to enhance the contrast of an image. However, an excessively small pattern size disadvantageously lowers the throughput and makes the mask manufacture difficult. Therefore, an excessively small size is not preferable. A practical lower limit would be about 80%.

In conclusion, when a binary mask has a desired pattern and an auxiliary pattern smaller than the desired pattern, it is understood that the desired pattern has a size corresponding to 80% to 90% of a size corresponding to a size to be formed on a substrate or wafer.

ELEVENTH EXAMPLE

This example uses an exposure with KrF (with a wavelength of 248 nm) and a numerical aperture of 0.73 for exposure with an illumination mode that provides an effective light source shape shown in FIG. 4A.

Figure 33:
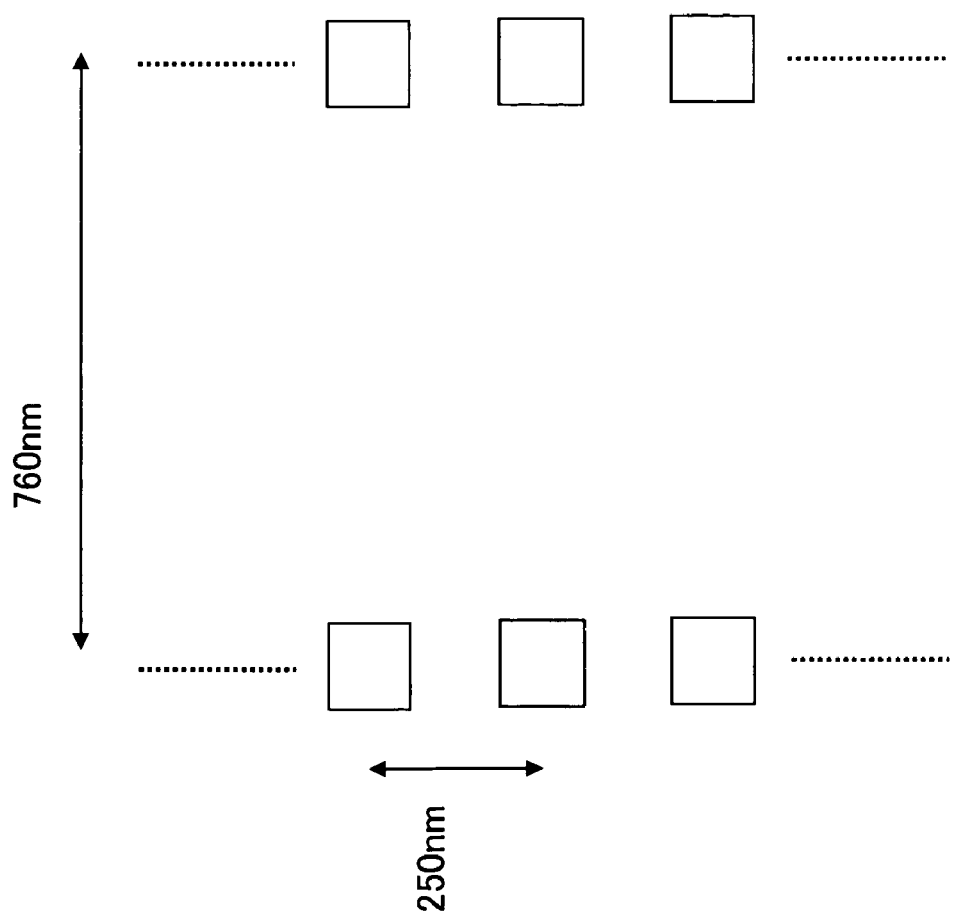
FIG. 33 is a view of an arrangement of a pattern.

Suppose a contact hole pattern shown in FIG. 33 under this condition. FIG. 33 shows eleven 120 nm contact hole patters at a period of 250 nm in a longitudinal direction (although FIG. 33 shows three center contact hole patterns for simplicity purposes), and there are two contact hole rows with an interval of 520 nm.

Figure 34:
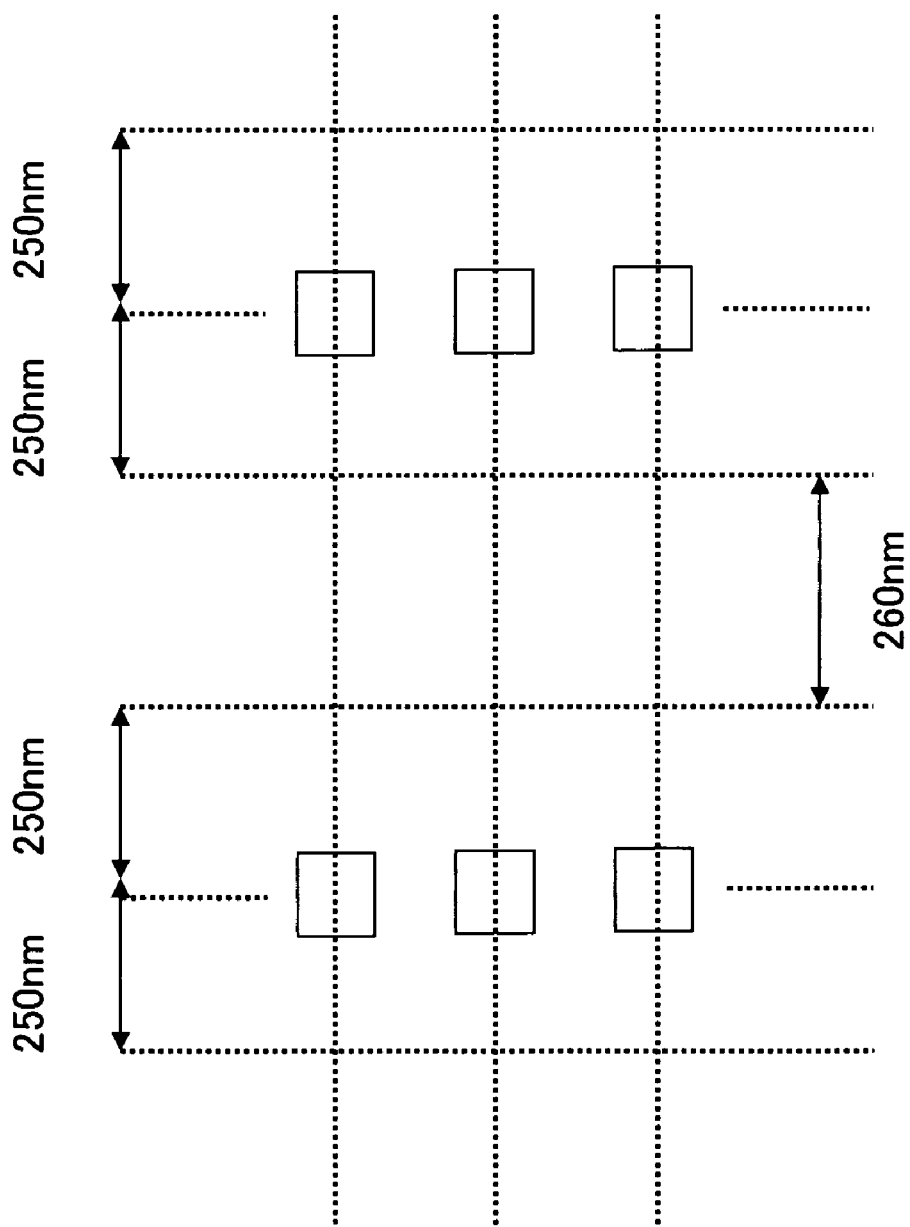
FIG. 34 is a view of an arrangement of a pattern.

According to the flowchart shown in FIG. 23, an auxiliary pattern may be inserted at a period of 760 nm/3=about 253 nm in a lateral direction. However, the instant example applies a period of a desired pattern even in a lateral direction, as shown in FIG. 34. In other words, a virtual lattice is formed at a period of 250 nm in the lateral direction. FIG. 34 is a view of a virtual lattice that applies the desired pattern shown in FIG. 33.

Figure 35:
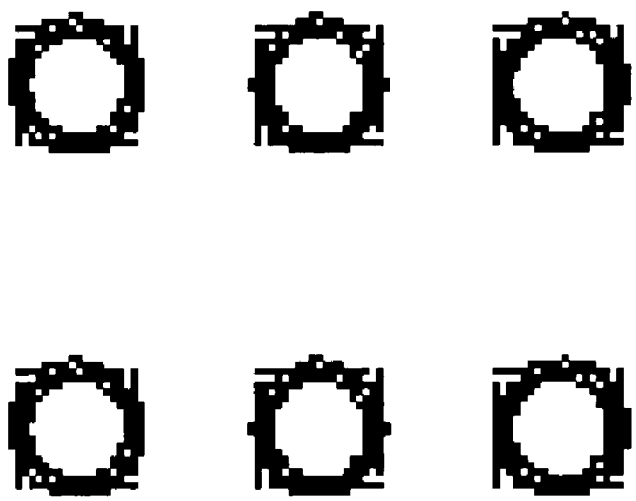
FIG. 35 is a view showing an exposure result.

The desired pattern resolved when an auxiliary pattern was normally arranged with respect to the virtual lattice (see FIG. 35). FIG. 35 is a view of an aerial image of a desired pattern on a wafer.

Figure 36:
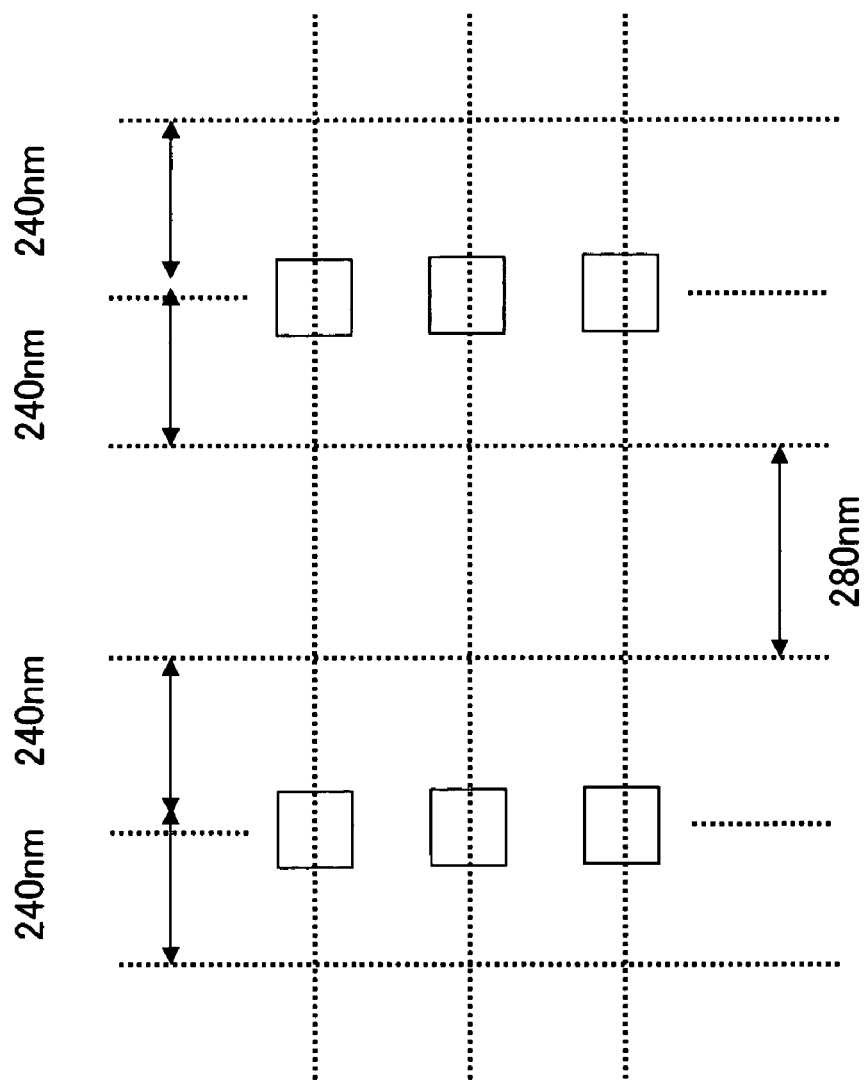
FIG. 36 is a view of an arrangement of a pattern.
Figure 37:
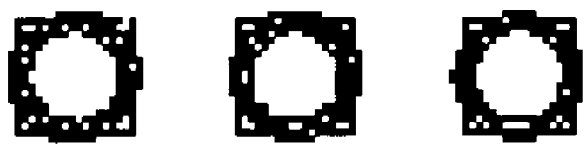
FIG. 37 is a view showing an exposure result.
Figure 37:
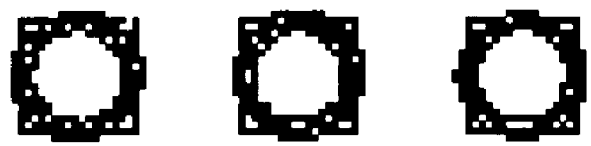

Next, a virtual lattice was formed at a period of 240 nm in a lateral direction as shown in FIG. 36 in view of a fact that the imaging performance improves when a ratio between a hole diameter and a space size is 1:1. The desired pattern resolved when an auxiliary pattern was normally arranged with respect to the virtual lattice (see FIG. 37). FIG. 37 is a view of an aerial image of a desired pattern on a wafer.

Although the instant example indicates a result of a normal arrangement of an auxiliary pattern, a method of inserting an auxiliary pattern of the instant embodiment is not limited to the normal arrangement. In other words, after a method described in this example determines the virtual lattice, an auxiliary pattern can be alternately arranged with respect to lattice points and auxiliary pattern centers.

Although specific examples of the present invention have been described above, the present invention can be enforced in different ways. This description does not intend to restrict the present invention. It should be noted that the present invention is applicable to any mask pattern.

The instant embodiment can transfer a pattern having different periods onto a wafer at one time and improves, as a secondary effect, resolving power rather than a mask that arranges only a desired pattern. Thus, the instant embodiment enables a conventional projection exposure apparatus to provide fine processing with a photo-mask.

Figure 1:
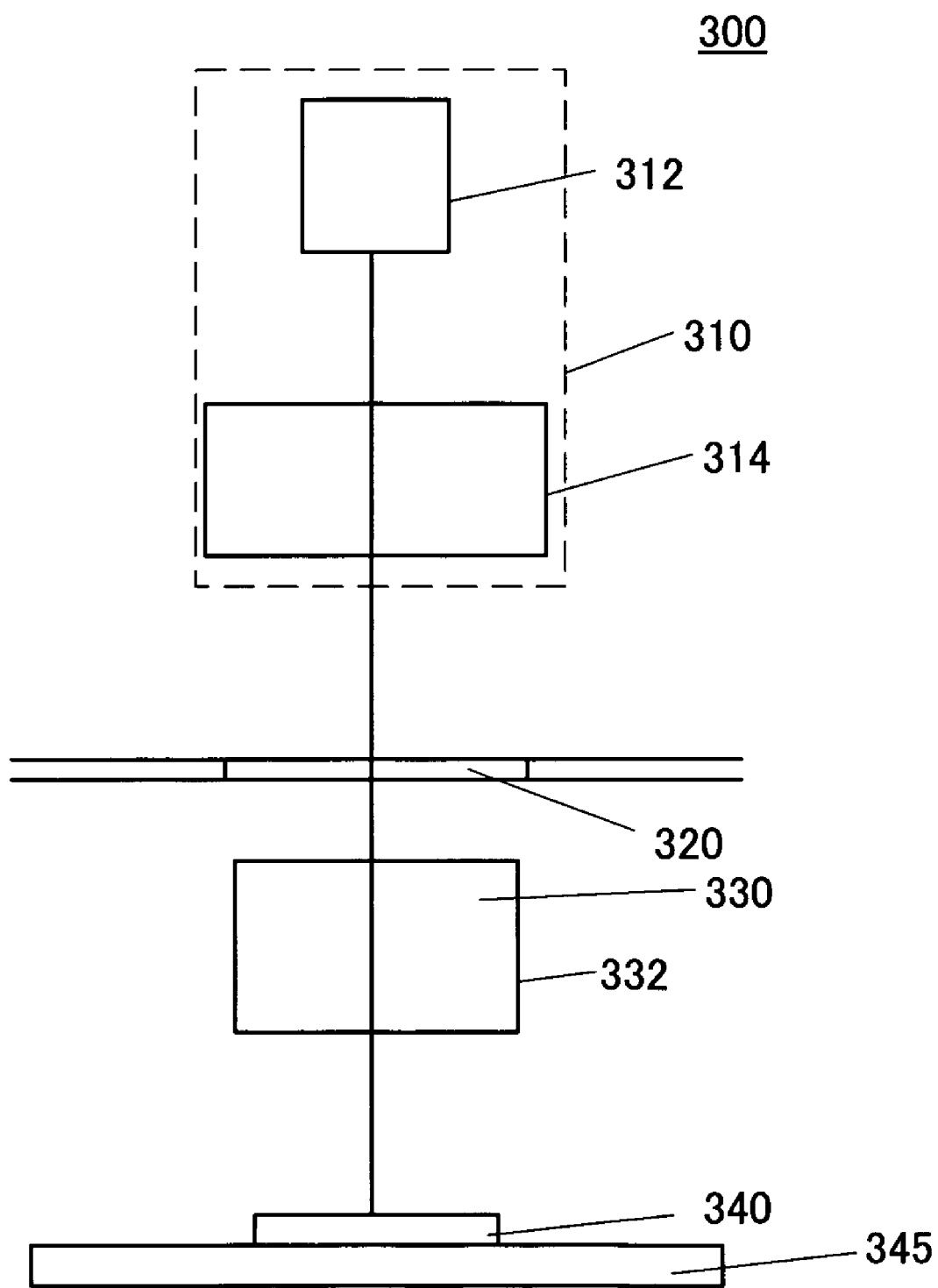
FIG. 1 is a diagram of a simplified optical path in an exposure apparatus of one embodiment according to the present invention.

Referring to FIG. 1, a description will be given of the inventive exposure apparatus 300 that exposes a mask. Here, FIG. 1 is a schematic block sectional view of the illustrative inventive exposure apparatus 300. The exposure apparatus 300 includes, as shown in FIG. 1, an illumination apparatus 310 for illuminating the above mask, a projection optical system 330 that projects diffracted light created from the illuminated mask pattern onto a plate 340, and a stage 345 for supporting the plate 340.

The exposure apparatus 300 is a projection exposure apparatus that exposes onto the plate 340 a circuit pattern created on the mask 320, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner"). The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

The illumination apparatus 310 illuminates the mask 320 which forms a circuit pattern to be transferred, and includes a light source unit 312 and an illumination optical system 314.

The light source unit 312 uses as a light source, for example, as ArF excimer laser with a wavelength of approximately 193 nm, a KrF excimer laser with a wavelength of approximately 248 nm, and $F_2$ laser with a wavelength of approximately 153 nm, but a type of laser is not limited to excimer laser and the number of laser units is not limited. When the light source unit 312 uses laser, it is desirable to employ a beam shaping optical system that shapes a parallel beam from a laser source to a desired beam shape, and an incoherently turning optical system that turns a coherent laser beam into an incoherent one.

The illumination optical system 314 is an optical system that illuminates the mask 320, and includes a lens, a mirror, a light integrator, a stop, and the like, for example, a condenser lens, a fly-eye lens, an aperture stop, a condenser lens, a slit, and an imaging optical system in this order. The illumination optical system 314 can use any light whether it is axial or non-axial light. The light integrator may include a fly-eye lens or an integrator formed by stacking two sets of cylindrical lens array plates (or lenticular lenses), and be replaced with an optical rod or a diffractive element.

The mask 320 is made, for example, of quartz, forms a circuit pattern (or an image) to be transferred, and is supported and driven by a mask stage (not shown). Diffracted light emitted from the mask 320 passes the projection optical system 330, thus and then is projected onto the plate 340. The mask 320 and the plate 340 are located in an optically conjugate relationship. Since the exposure apparatus 300 of this embodiment is a scanner, the mask 320 and the plate 340 are scanned at the speed ratio of the reduction ratio, thus transferring the pattern on the mask 320 to the plate 340. If it is a step-and-repeat exposure apparatus (referred to as a "stepper"), the mask 320 and the plate 340 stand still in exposing the mask pattern. The mask 320 forms the above desired pattern and auxiliary pattern.

The projection optical system 330 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The plate 340 is an object to be exposed such as a wafer and a liquid crystal plate, and photoresist is applied onto it. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photo-resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The stage 345 supports the plate 340. The stage 340 may use any structure known in the art, and a detailed description of its structure and operation is omitted. The stage 345 may use, for example, a linear motor to move the plate 340 in XY directions. The mask 320 and plate 340 are, for example, scanned synchronously, and the positions of the stage 345 and a mask stage (not shown) are monitored, for example, by a laser interferometer and the like, so that both are driven at a constant speed ratio. The stage 345 is installed on a stage stool supported on the floor and the like, for example, via a damper, and the mask stage and the projection optical system 330 are installed on a lens barrel stool (not shown) supported, for example, via a damper to the base frame placed on the floor.

In exposure, light emitted from the light source 312, e.g., Koehler-illuminates the mask 320 via the illumination optical system 314. Light that passes through the mask 320 and reflects the mask pattern is imaged onto the plate 340 by the projection optical system 330. The mask 320 used for the exposure apparatus 300 enhances imaging performance of the desired pattern through the auxiliary pattern (for example, by turning it into a circle-like shape) and increases the depth of focus, thus improving operability to provide high-quality devices (such as semiconductor devices, LCD devices, photographing devices (such as CCDs, etc.), thin film magnetic heads, and the like) than the conventional exposure.

Figure 7A:
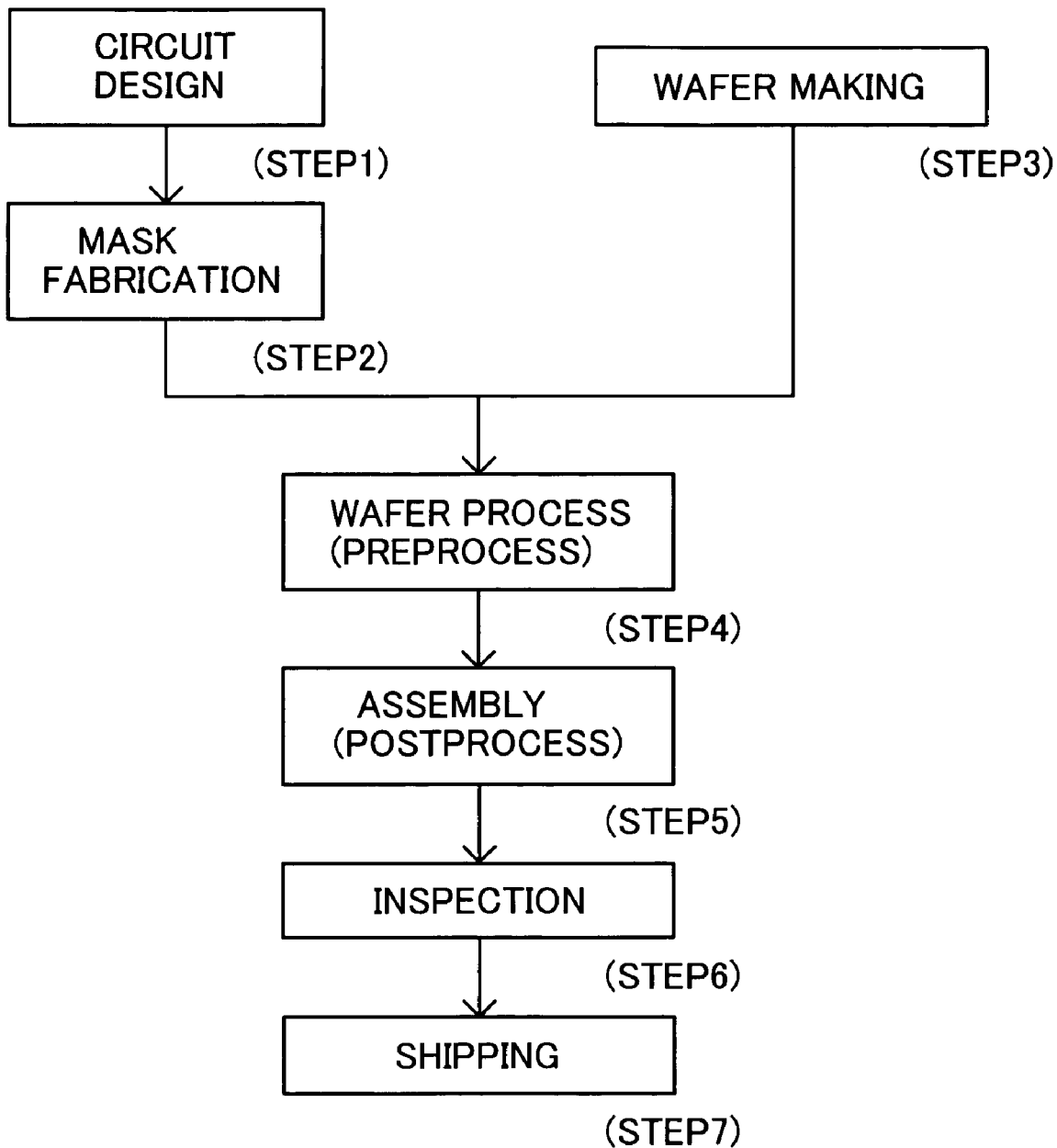
FIG. 7A is a flowchart for explaining a device fabricating method using the exposure apparatus shown in FIG. 1.
Figure 7B:
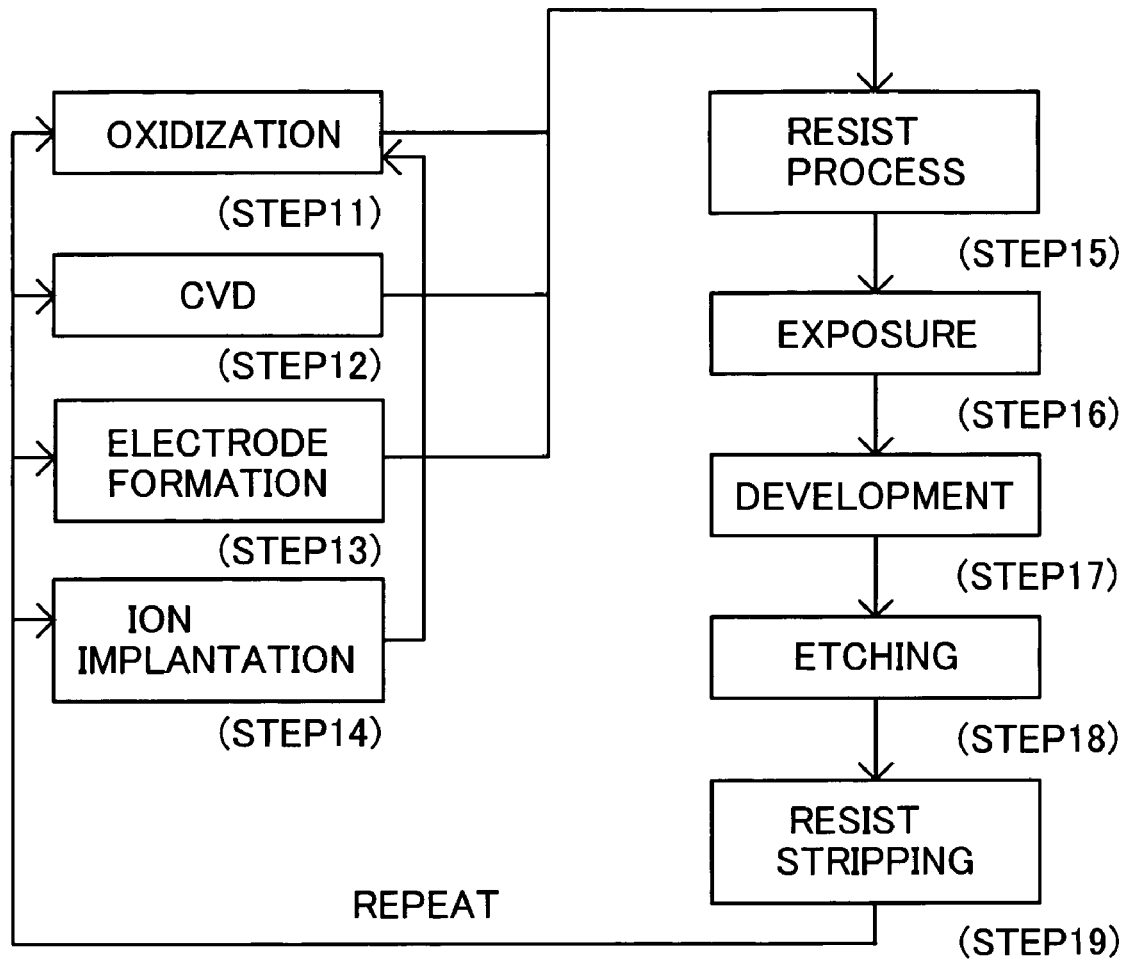
FIG. 7B is a detailed flowchart of wafer process in step 4.

Referring now to FIGS. 7A and 7B, a description will be given of an embodiment of a device fabrication method using the above exposure apparatus. FIG. 7A is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7B is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever.

Thus, the present invention can provide a mask and its manufacturing method, an exposure method that can expose, without exchanging a mask, a pattern that has one or more contact holes with a fine hole diameter, with high resolution.

What is claimed is:

1. A mask comprising plural contact hole patterns, and plural auxiliary patterns, each auxiliary pattern being smaller than each contact hole pattern,
   wherein the plural auxiliary patterns include a first auxiliary pattern and plural second auxiliary patterns, centers of the contact hole patterns and a center of the first auxiliary pattern being at regular periods in a line, the plural second auxiliary patterns each having a center that is offset from the line and equally distant from two adjacent centers among the contact hole patterns and the first auxiliary pattern, and
   wherein the plural second auxiliary patterns are arranged at both sides of the line.

2. An exposure method comprising the step of illuminating a mask according to claim 1 by using light that enables the plural contact hole patterns to resolve and prevents the plural auxiliary patterns from resolving, and exposing an object using the light from the mask.

3. An exposure method according to claim 2, wherein the light that enables the plural contact hole patterns to resolve and prevents the plural auxiliary patterns from resolving form an effective light source having a dark center portion.

4. A device fabricating method comprising the steps of: exposing an object by using an exposure method according to claim 2; and developing the object that has been exposed.

5. A mask according to claim 1, wherein centers of the plural auxiliary patterns are aligned with a line parallel to the line, and are arranged on the parallel line at the same as a period of the plural contact hole patterns.

6. A mask according to claim 1, wherein centers of the contact hole patterns and a center of the first auxiliary pattern being at regular periods in a line, the plural second auxiliary patterns having centers that is offset from the line, and equally distant from both the center of the first auxiliary pattern and the center of the contact hole pattern that is closest to the second auxiliary pattern.

7. A mask according to claim 1, wherein a distance between centers of the plural second auxiliary patterns and the line is a period of the plural contact hole patterns.

8. A mask designing method for designing a mask that includes plural contact hole patterns, and plural auxiliary patterns having a first auxiliary pattern and plural second auxiliary patterns, each auxiliary pattern being smaller than each contact hole pattern, the mask enabling plural contact hole patterns to resolve and while preventing the plural auxiliary patterns from resolving, said mask designing method comprising the steps of:
   arranging a first auxiliary pattern so that centers of the contact hole patterns and a center of the first auxiliary pattern being at regular periods in a line; and
   arranging plural second auxiliary patterns each having a center that is offset from the line, and equally distant from two adjacent centers among the first auxiliary pattern and the contact hole patterns, and the plural second auxiliary patterns are located at both sides of the line.

9. A mask designing method according to claim 8, wherein centers of the plural auxiliary patterns are aligned with a line parallel to the line, and are arranged on the parallel line at the same as a period of the plural contact hole patterns.

10. A mask designing method according to claim 8, wherein centers of the contact hole patterns and a center of the first auxiliary pattern being at regular periods in a line, the plural second auxiliary patterns having a center that is offset from the line, and equally distant from both the center of the first auxiliary pattern and the center of the contact hole pattern that is closest to the second auxiliary pattern.

* * * * *